(12) United States Patent
Mizuno et al.

(10) Patent No.: US 6,525,985 B2
(45) Date of Patent: *Feb. 25, 2003

(54) SEMICONDUCTOR MEMORY DEVICE

(75) Inventors: Hiroyuki Mizuno, Kokubunji; Suguru Tachibana, Marugame; Koichiro Ishibashi, Warabi; Kenichi Osada, Kokubunji, all of (JP)

(73) Assignee: Hitachi, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/577,366

(22) Filed: May 23, 2000

(65) Prior Publication Data

US 2002/0018359 A1 Feb. 14, 2002

Related U.S. Application Data

(63) Continuation of application No. 09/291,272, filed on Apr. 14, 1999, which is a continuation of application No. 08/705,315, filed on Aug. 29, 1996, now Pat. No. 5,943,284.

(30) Foreign Application Priority Data

Aug. 31, 1995 (JP) ............................................. 7-223015
May 17, 1996 (JP) ............................................. 8-123070

(51) Int. Cl.[7] ................................................. G11C 5/14
(52) U.S. Cl. .................... 365/230.03; 365/49; 365/154; 365/185.11; 365/185.24
(58) Field of Search ........................... 365/154, 189.08, 365/222, 203, 207, 204, 210, 227

(56) References Cited

U.S. PATENT DOCUMENTS

| 4,831,591 A | * 5/1989 | Imazeki .................. 365/189.08 |
| 5,473,568 A | 12/1995 | Okamura |
| 5,499,216 A | 3/1996 | Yamamoto |
| 5,668,770 A | 9/1997 | Itoh et al. |

FOREIGN PATENT DOCUMENTS

| JP | 1166394 | 6/1989 |
| JP | 3-83289 | 4/1991 |

OTHER PUBLICATIONS

A 1–V 100–MHz 10–mW Caceh using a Separated Bit–Line Memory Hierarchy Architecture and Domino Tag Comparators, H. Mizuno et al, pp. 1–4.
IEEE 1990 Symposium on VLSI Circuits, A IV Operating 256—Kbit Full Cmos Sram, A. Sekiyama et al, pp. 53–54.
1994 IEEE Symposium on Low Power Electronics, Low–Power Design of Memory Intensive Functions, D. Lidsky et al, pp. 16–17.

* cited by examiner

*Primary Examiner*—Son T. Dinh
(74) *Attorney, Agent, or Firm*—Mattingly, Stanger & Malur, P.C.

(57) ABSTRACT

A memory structure/circuit has at least two memory cell arrays connected to each other in a hierarchy. The bit lines of the two or more memory cell arrays are connected by hierarchy switches. The memory cells of one of the arrays can be read out faster than the others by using the hierarchy switches to select one array without selecting the other arrays. So the data that is read with higher frequency can be selectively read out faster if it is stored in the faster access memory array. If the data in the faster access memory cell array includes a copy of the data in the other array, it can be used as a cache memory. A tag array and data array in combination that are connected to another tag array and data array in combination through hierarchy switch connections can provide a cache memory that is direct mapped or set associative, and also full associative. The memory device can be used in a semiconductor data processor having a CPU in which the memory device is connected to the CPU through a bus, wherein both the CPU and the memory device are formed on a single semiconductor substrate. The memory device can also be an off-chip device.

12 Claims, 23 Drawing Sheets

| Capacity | 2 KB (L1-array) + 16 KB (L2-array) |
|---|---|
| Associativity | 4-way set-associative |
| Line size | 128 b |
| Power supply | 1.0 V, 10 mW (at 1.0 V, 100 MHz) |
| Active die area | 3.6 × 2.1 mm (7.6 mm$^2$) |

| Technology | 0.25-$\mu$m CMOS, 1 poly, 3 metal |
|---|---|
| Memory cell | 6-Tr (4.25 × 5.9 $\mu$m) |
| MOSFET tox | 4.5 nm |
| Vth * | 0.3 V (n) / -0.3 V (p), Peripheral<br>0.5 V (n) / -0.5 V (p), Memory cell |

* VTO in spice simulator

SEMICONDUCTOR MEMORY DEVICE

This is a continuation application of U.S. patent application Ser. No. 09/291,272, filed Apr. 14, 1999, which is a continuation of U.S. application Ser. No. 08/705,315, filed Aug. 29, 1996 now U.S. Pat. No. 5,943,284.

FIELD OF THE INVENTION

The present invention relates to a semiconductor integrated circuit device and, more particularly, to a semiconductor memory device which is suitable for high speed and low power consumption operations and to a semiconductor data processor such as a microcomputer or a microprocessor using such a semiconductor memory device.

BACKGROUND OF THE INVENTION

Employing techniques for lower power consumption is essential for elongating the lifetime of a battery in a PDA (Personal Digital Assistant) or a portable personal computer. In a high end microcomputer, too, the problem of heat generation resulting from power consumption becomes serious in the sense of deteriorating the reliability of the device.

A known technique for reducing the power consumption of a memory circuit is exemplified in the prior art by lowering the supply voltage, as disclosed on pp. 53 and 54 of 1990 Symposium on VLSI Circuit, Digest of Technical Papers (1990), which is hereinafter referred to as prior art(1).

There is another method by which a memory of smaller capacity is placed in a lower hierarchy of an architecture having a multi-hierarchy memory, as disclosed on pp. 16 and 17 of 1994 IEEE Symposium on Low Lower Electronics, Digest of Technical Papers (1994) (Prior Art 2). Generally speaking, a memory of the smaller storage capacity can be constructed to have the lower load resistance and capacity in its bit lines or the like so that it can be operated in the lower power consumption. In this example of the prior art, the power consumption is reduced by enhancing the frequency of accessing the memory of as low hierarchy as possible to have the smaller capacity, i.e., the memory of the lower power consumption.

SUMMARY OF THE INVENTION

A portable information device of high-speed and low power consumption is realized with a cache memory built-into a semiconductor data processor, such as a microprocessor, providing a high hit ratio. Since the access of an off chip memory, of which a load is large, can be decreased with a built-in type of cache memory providing a high hit ratio, the power consumption of the whole portable information device can be reduced. And, because the access of the memory of which the latency is long decreases, speed-up can be attained.

Recent trends have resulted in the storage capacity of the memory installed in a semiconductor data processor such as a microcomputer or a microprocessor to be increased. As a result, the number of memory cells connected to the bit lines of the memory array of the internal memory has increased (which enlarges the load) to increase the access time. In order to shorten this access time, therefore, it is necessary to increase the current of the memory cells. This increase in the current of the memory cells can be realized by lowering the threshold voltage of the MOS (Metal-Oxide-Semiconductor) transistors. However, the present inventors have found that the lowering of the threshold voltage brings about the following problem in a low supply voltage range of 1 V.

FIG. 14 illustrates the static noise allowance of the memory cells for the threshold voltages (Vth) of 0.5 V and 0.3 V when the supply voltage is 1 V. As illustrated in FIG. 14, the static noise allowance is 0.4 V for vth=0.5 V and is 0.25 V for Vth=0.3 V. In other words, the static noise allowance is reduced by 38% if the threshold voltage is lowered by 0.2 V. From the standpoint of reliability, therefore, there arises a problem that the threshold voltage of a MOS transistor composing memory cells cannot be lowered.

If, moreover, a memory of large storage capacity is used in the low voltage operation, the following problem arises, as found by the inventors.

FIG. 15 illustrates the dependency of the read rate on the supply voltage in a secondary cache memory (L2-cache) of 16 Kbytes and a primary cache memory (L1-cache) of 2 Kbytes. The pie charts show the ratios (which means the memory cell current ability) of the time period till a predetermined potential difference arises in the bit line pairs (that is, the time period till the sense amplifier can be started, which will be hereinafter referred to as the memory cell time) to the entire read time period. In the supply voltage range as high as 2.5 V or the like, as shown in FIG. 15, the portion, which is occupied by the memory cell time period of the primary cache memory and the secondary cache memory, is as low as 30% or less. In the supply voltage range as low as 1 V or the like, however, the portion, which is occupied by the memory cell time period of the secondary cache memory, exceeds 50%, as shown in FIG. 15. In short, in order to improve the read time period in the supply voltage range as low as 1 V or the like, it is necessary to increase the current of the memory cells. As described above, however, the threshold voltage of a MOS transistor composing memory cells cannot be lowered.

In the prior art (1), the memory which is operable at the supply voltage of 1 V is described, but there is no description of the aforementioned problem which has been found out by the inventors.

As described in connection with the prior art (2), moreover, the method of arranging a plurality of memories of small storage capacity requires the use of a peripheral circuit such as a decoder for each memory, which brings about the problem enlarging the circuit scale. On the other hand, when the power consumed by the memory array itself can be reduced, there arises a problem that the power consumed by the peripheral circuit or the like, due to the arrangement of the plurality of memories, increases.

For the known techniques, therefore, it is difficult to solve all of the considerations involving attempts at reducing power consumption, to speed up the operations and to reduce the circuit scale.

An object of the present invention is to provide a semiconductor memory device capable of operating at high speed and with low power consumption, and a semiconductor data processing device having such a semiconductor memory device packaged therein.

Another object of the present invention is to provide a memory structure/circuit capable of solving the aforementioned problem of the reduction of speed due to the low voltage.

Yet another object of the present invention is to provide a memory structure/circuit capable of solving the problem of the increase in the circuit scale when memory arrays are connected together in a hierarchy.

A further object of the present invention is to provide a cache memory which is suited to be packaged in a data processing device such as a microprocessor.

A representative one of the inventions disclosed herein will be briefly summarized in the following.

(1) A semiconductor memory device has: a first memory array (MAS) including a plurality of word lines (WS1 and so on), a first bit line pair (BS1, BSB1 and so on), and a plurality of memory cells (M) arranged at the intersections of the plurality of word lines and the first bit line pair; a second memory array (MAF) including a plurality of word lines (WF1 and so on), a second bit line pair (BF1, BFB1 and so on), and a plurality of memory cells (M) arranged at the intersections of the plurality of word lines and the second bit line pair; a sense amplifier (SA1 and so on) for amplifying a signal outputted to the second bit line pair; and switch means (HS1) for controlling the connection between the first bit line pair and the second bit line pair, wherein a signal outputted to the first bit line pair is transmitted through the switch means and the second bit line pair to the sense amplifier.

(2) A semiconductor memory device has: a first memory array (MAS) including a plurality of word lines (WS1–WSp), a first bit line pair (M) arranged at the intersections of the plurality of word lines and the first bit line pair; and a second memory array (MAE) including a plurality of word lines (WF1–WFq), a second bit line pair (BF1, BFB1–BFn, BFBn), and a plurality of memory cells (M) arranged at the intersections of the plurality of word lines and the second bit line pair, wherein the number of word lines included in the second memory array is smaller than that of word lines included in the first memory array, and wherein the first bit line pair and the second bit line pair are connected through switch means whose electrical connection state is controlled by a control signal (HS1).

(3) A semiconductor memory device has: first and second word line groups including a plurality of word lines; first and second bit line pair groups including a plurality of bit line pairs; and a plurality of memory cells (M) arranged in a matrix form at the intersections between the first word line group and the first bit line group and at the intersections between the second word line group and the second bit line group, wherein each bit line pair (BS1, BSB1–BSn, BSBn) of the first bit line pair group and each bit line pair (BF1, BFB1–BFn, BFBn) of the second bit line pair group are connected through first switch means (HS1 and so on), (4) A semiconductor memory device has first, second and third memory cell arrays (DAS, DAF and TAF) and a comparator (CMP1), wherein each of the first, second and third memory cell arrays includes a plurality of word lines, a plurality of bit line pairs, and a plurality of memory cells arranged at the intersections between the plurality of word lines and the plurality of bit line pairs, wherein each bit line pair of the first memory cell array and each bit line pair of the second memory cell array are connected through switch means, wherein the comparator compares the address signal with the stored content of the third memory cell array, and wherein the switch means is turned on if the comparator indicates a difference in the result of the comparison.

(5) A semiconductor memory device has first, second and third memory cell arrays (MAS, MAF and MAT), wherein each of the first, second and third memory cell arrays includes a plurality of word lines (WS1–WSp, WF1–WFq, WT1–WTu), a plurality of bit lines (BS1, BSB1; BF1, BFB1; BT1, BFB1 and so on), and a plurality of memory cells (M) arranged at the intersections between the plurality of word lines and the plurality of bit lines, wherein the bit lines of the first memory cell array and the bit lines of the second memory cell arrays are individually connected through first switch means (HS1, HSB1 and so on), and wherein the bit lines of the first memory cell array and the bit lines of the third memory cell array are individually connected through second switch means (HT1, HTB1 and so on).

(6) A semiconductor memory device has: a first memory array (MAS) including a plurality of first word lines (WS1–WSp), a first bit line pair (BS1, BSB1 and so on), and a plurality of memory cells (M) arranged at the intersections of the plurality of word lines and the first bit line pair; a second memory array (MAF) including a plurality of second word lines (WF1–WFq), second and third bit line pairs (BF1, BFB1; BF1T, BFB1T and so on), and a plurality of dual port memory cells (D) arranged at the intersections of the plurality of word lines and the second and third bit line pairs and connected to the second and third bit line pairs; first switch means (HS1 and so on) connected between the first bit line pair and the second bit line pair; second switch means (HU1 and so on) connected between the first bit line pair and the third bit line pair, a first sense amplifier circuit (SA1 and so on) for amplifying the output of the second bit line pair; and a second sense amplifier circuit (SA1U and so on) for amplifying the output of the third bit line pair.

(7) A semiconductor memory device has: a first memory array (MAS) including a plurality of first word lines (WS1 and so on), a first bit line pair (SS1, SSB1 and so on), and a plurality of memory cells (M) arranged at the intersections of the plurality of word lines and the first bit line pair, a second memory array (MAF) including a plurality of second word lines (WF1 and so on), a second bit line pair SF1, SFB1 and so on), and a plurality of memory cells (M) arranged at the intersections of the plurality of word lines and the second bit line pair; and a third bit line pair (BF1, BFB1, and so on) connected to the first bit line pair through first switch means (HF1 and so on) and connected to the second bit line pair through second switch means (HE1 and so on), wherein the length of the second bit line pair is smaller than that of the first bit line pair.

(8) A semiconductor device has first, second, third and fourth memory cell arrays and a comparator, wherein each of the first, second, third and fourth memory cell arrays includes a plurality of word lines, a plurality of bit line pairs, and a plurality of memory cells arranged at the intersections between the plurality of word lines and the plurality of bit line pairs, wherein the individual bit line pairs of the first memory cell array and the individual bit line pairs of the second memory cell array are connected through first switch means, wherein the individual bit line pairs of the third memory cell array and the individual bit line pairs of the fourth memory cell array are connected through second switch means, and wherein the address signal is compared with the stored content of the second memory cell array by the comparator, and if the result of comparison of the comparator is inconsistency, the first and second switch means are turned on.

(9) A semiconductor data processor has: a CPU and a memory device connected to the CPU through a bus, both the CPU and the memory device being formed on a single semiconductor substrate, wherein the memory device includes: a first tag array for storing a plurality of address data at the same address; a first data array for storing a plurality of data at the same address; a second tag array for storing a plurality of address data at the same address;

a second data array for storing a plurality of data at the same address; and a plurality of comparators for comparing an address signal inputted from the bus and the address data stored in the first or second tag array, wherein the bit lines of the first tag array and the bit lines of the second tag array are connected through first switch means, wherein the bit lines of the first data array and the bit lines of the second data array are connected through second switch means, wherein sense amplifiers are individually connected to the bit lines of the first tag array and the first data array, and wherein the outputs of the sense amplifiers connected to the bit lines of the first data array are connected with the bus.

(1) By turning on the switch means (HS1 and so on), the memory array can be used as one having a large storage capacity. By turning off the switch means (HS1 and so on), the bit lines of the first memory array (MAF) can be disconnected to lighten the load upon the bit lines of the second memory array (MAS). As a result, the memory cells of the second memory array (MAF) can be read out faster than those of the first memory array (MAS). The data read out frequently can be read out selectively fast if it is stored in the second memory array. Because of the light load on the bit lines, moreover, the power consumed by accessing the memory cells in the second memory array (MAF) can be made lower than that by accessing the memory cells in the first memory array (MAS). If data of high access frequency is stored in the second memory array, on the other hand, the effective power consumption designed by considering the access frequency can be efficiently reduced.

(2) If the number of word lines contained in the second memory array (MAF) is smaller than that of the word lines contained in the first memory array (MAS), the storage capacity of the second memory array (MAF) is reduced. If the data in the first memory array (MAS) is made to include the data. in the second memory array (MAF), the second memory array (MAF) can be used like a cache memory in the first memory array (MAS). If the data used frequently among the data of the first memory array (MAS) is stored in the second memory array (MAF), the speed can be effectively raised to reduce the power consumption.

(3) If the second memory array (DAF) is used as a data array of the primary cache memory, if the first memory array (DAS) is used as a data array or main memory of the secondary cache memory, if the third memory array (TAF) is used as a tag array of the primary cache memory and if the third memory array (TAF) has no desired address data, the data of the secondary cache memory or the main memory can be read out by turning on the switch means.

(4) By connecting the third memory array (MAT), the first memory array (MAS) and the second memory array (MAF) in this order by the second switch means (HT1 and so on) and the first switch means (HG1 and so on) and by turning off the first switch means (HS1 and so on) between the first memory array (MAS) and the second memory array (MAF), the reading of the second memory array (MAF) can be faster than the reading of the first memory array (MAS) and the third memory array (MAT). By turning off the second switch means (HT1 and so on) between the third memory array and the first memory array and by turning on the first switch means (HS1 and so on) between the first memory array (MAS) and the second memory array (MAF), the first memory array (MAS) can be read out faster than the third memory array (MAT). High speed reading can be realized if the data accessed frequently is stored in the second memory array (MAF) or the first memory array (MAS). The order of power consumption is the second memory array (MAF), the first memory array (MAS) and the third memory array (MAT), and the access to the second memory array (MAF) is the smallest.

(5) A dual port structure can be realized if the data in the first memory array (MAS) is given an inclusion relation between the data in the second memory array (MAF) and the data in the third memory array (MAT) and if a sense amplifier (SA1T) is connected to the third memory array (MAT). Thus, a dual port access can be effected at a high probability using memory cells M of single port. This can also be used as a cache memory, so that the dual port cache memory can be realized. Since the bit lines of the second memory array (MAF) can be provided separately from those of the first memory array (MAS) and since the bit lines of the third memory array (MAT) can be provided separately from those of the first memory array (MAS), the power consumption can be reduced, and the second memory array (MAF) and the third memory array (MAT) can be accessed at a high reading speed. Moreover, if the two ports of the dual port cache memory are connected to an instruction path and a data path, it is possible to realize a cache memory having both an instruction cache and a data cache, thereby to realize performance effectively similar to that of a separate cache by using a unified cache.

(6) The first memory array (MAS) and the second memory array (MAF) of the dual port memory are connected through the first switch means (HS1 and so on) and the second switch means (HU1 and so on). Since the second memory array (MAF) is made to have the dual ports, most memory accesses are made locally to the second memory array (MAF) having a dual port structure, so that the storage capacity of the second memory array (MAF) can be suppressed to restrict the area increase caused by the multi-port memory cells.

(7) The first memory array (MAS) and the second memory array (MAF) are individually connected to the common bit lines through the first switch means (HF1) and the second switch means (HE1), and the sense amplifier (SA1) is connected to the common bit lines on the second memory array side. As a result, if the second switch means is turned off, the load upon the bit lines of the second memory array disappears, so that the first memory array is read out fast.

(8) If the second memory array (TAF) and the first memory array (TAS) are used as a tag array and if the fourth memory array (DAF) and the third memory array (DAS) are used as the data array, the second memory array (TAF) and the fourth memory array (DAF) can be operated as cache memories of the first memory array (TAS) and the third memory array (DAS), to provide a cache memory which is equipped with the primary cache memory (TAF and DAF) and the secondary cache memory (TAS and DAS). The direct mapped type cache memory can be realized by using a set of tag arrays and data arrays, and the set-associative type cache memory can be realized if a plurality of sets of tag arrays and data arrays are used.

The foregoing and remaining objects and the novel features of the present invention will become apparent from the resent specification and the accompanying drawings.

BRIEF DESCRIPTION OF THE PREFERRED EMBODIMENTS

Figure 1:
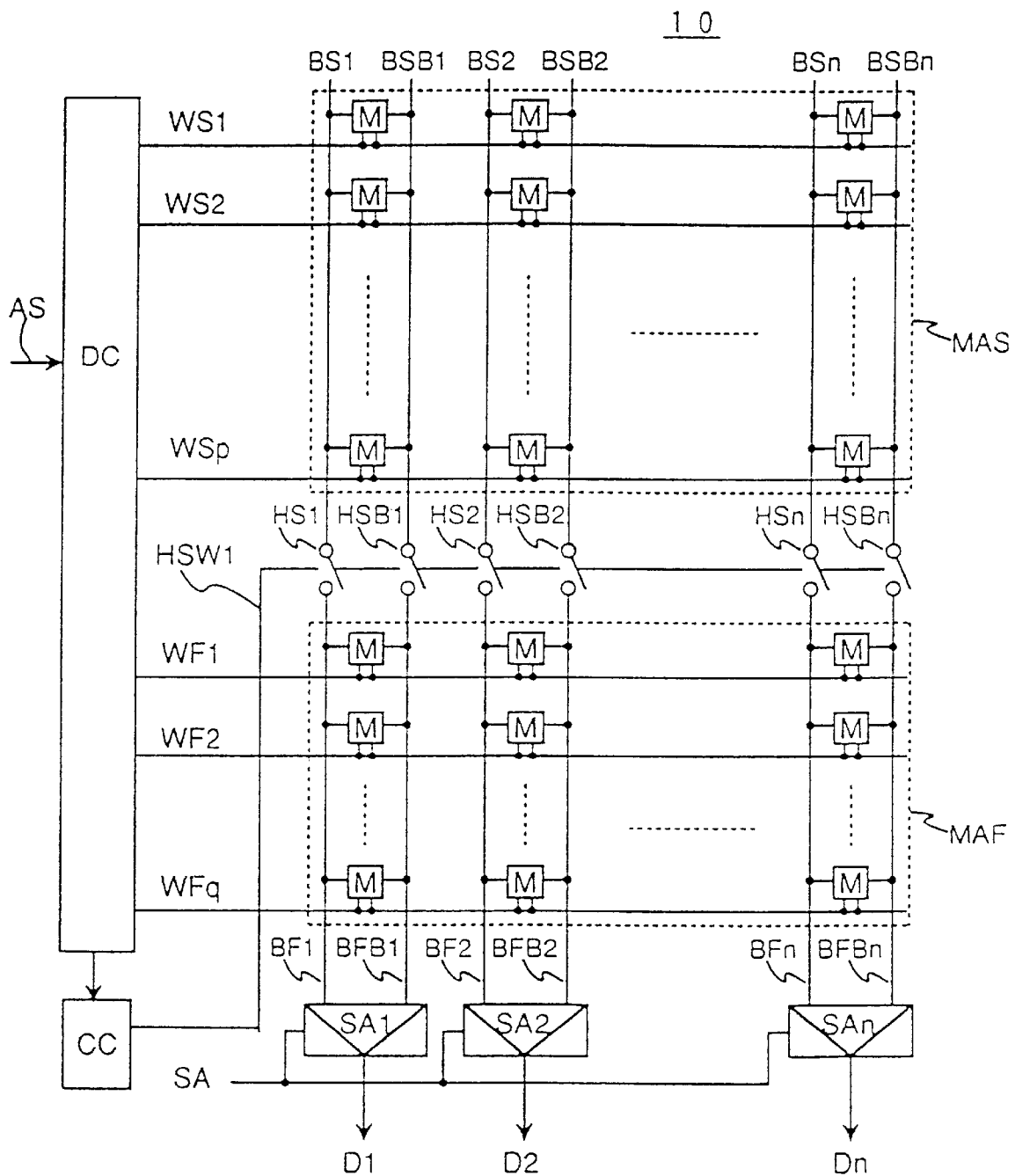
FIG. 1 is a diagram showing the construction of a memory device of a first embodiment of the present invention.
Figure 9:
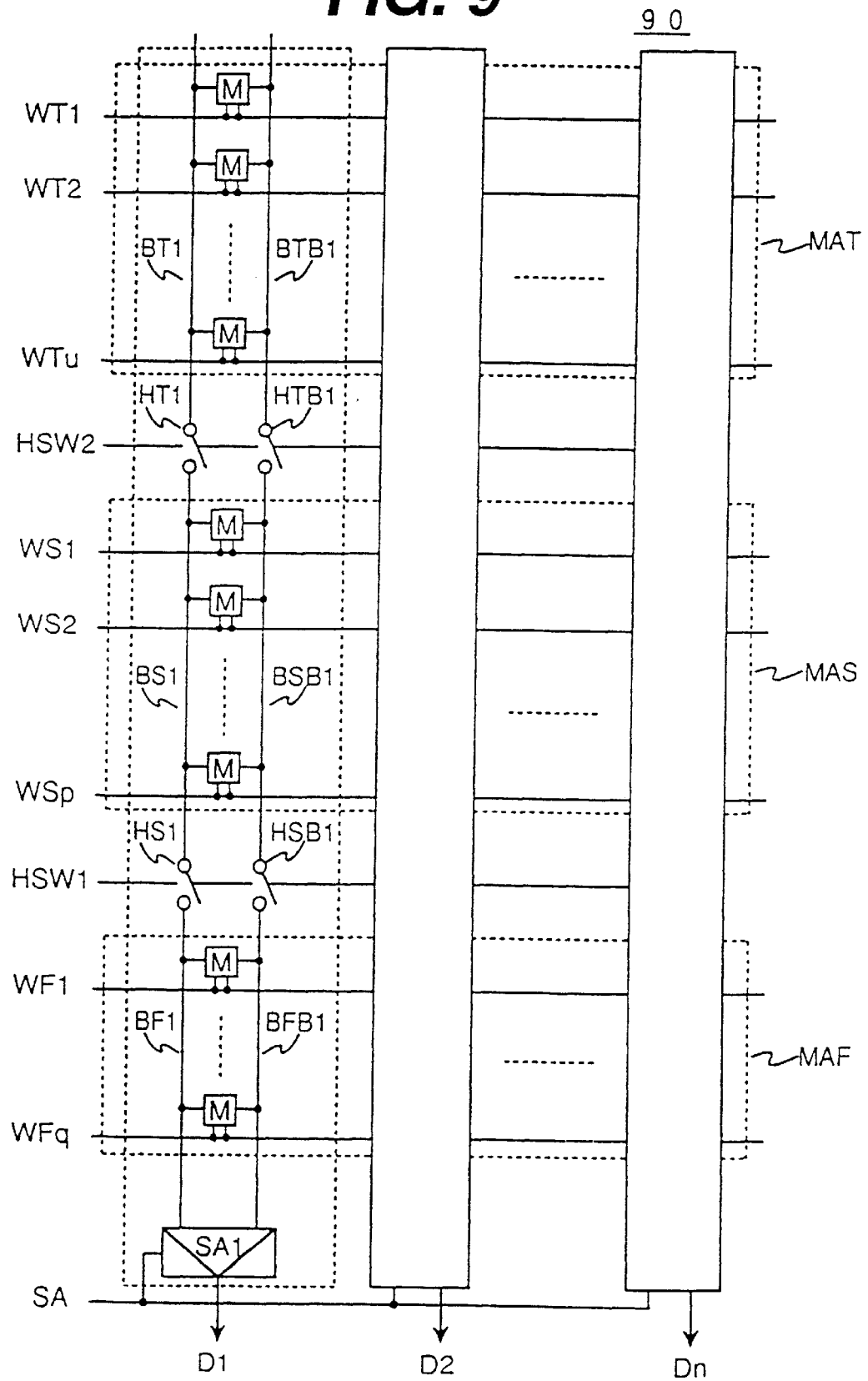
FIG. 9 is a diagram showing the construction of a memory device of a fifth embodiment of the present invention.
Figure 10:
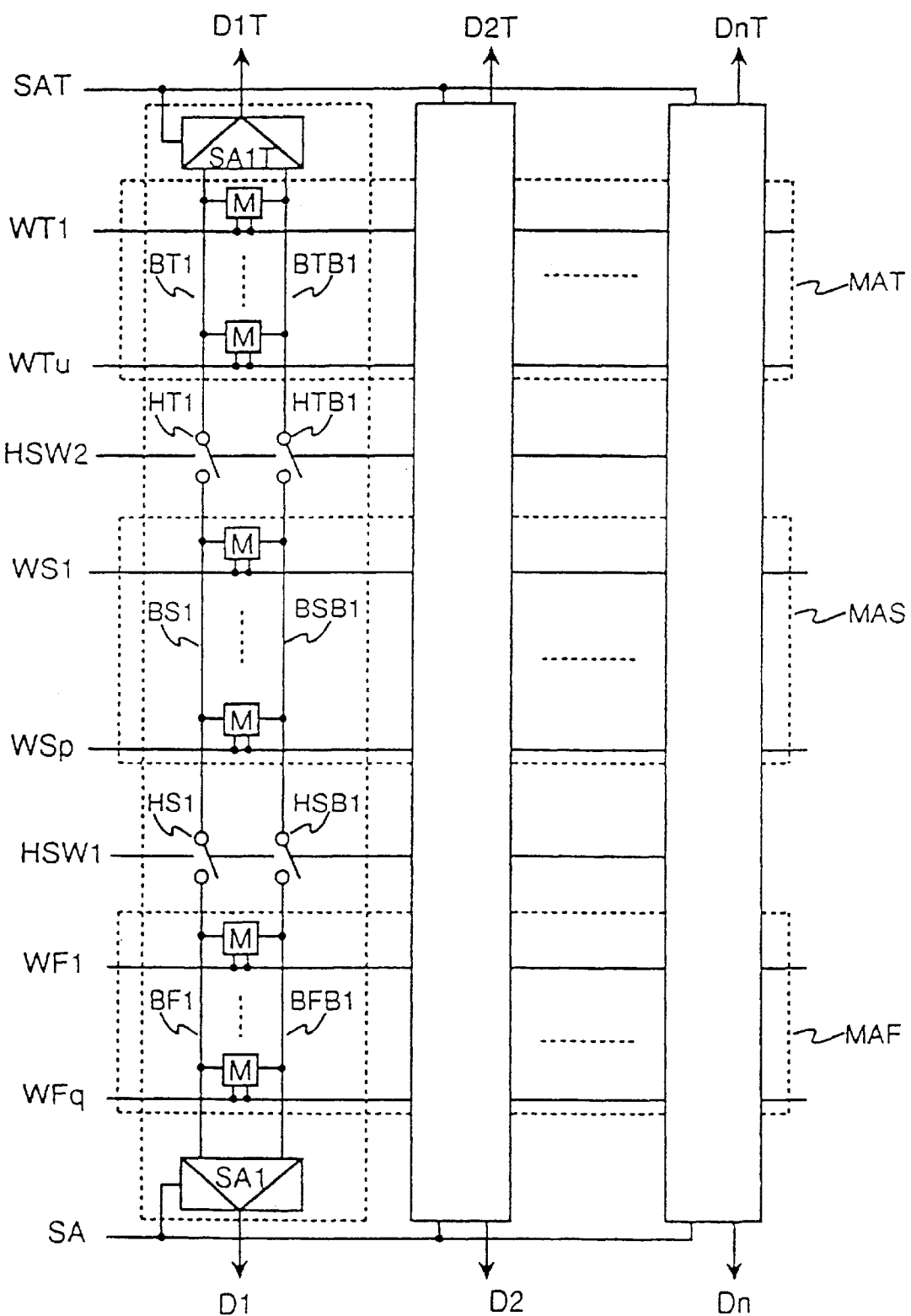
FIG. 10 is a diagram showing the construction of a memory device of a sixth embodiment of the present invention.
Figure 11:
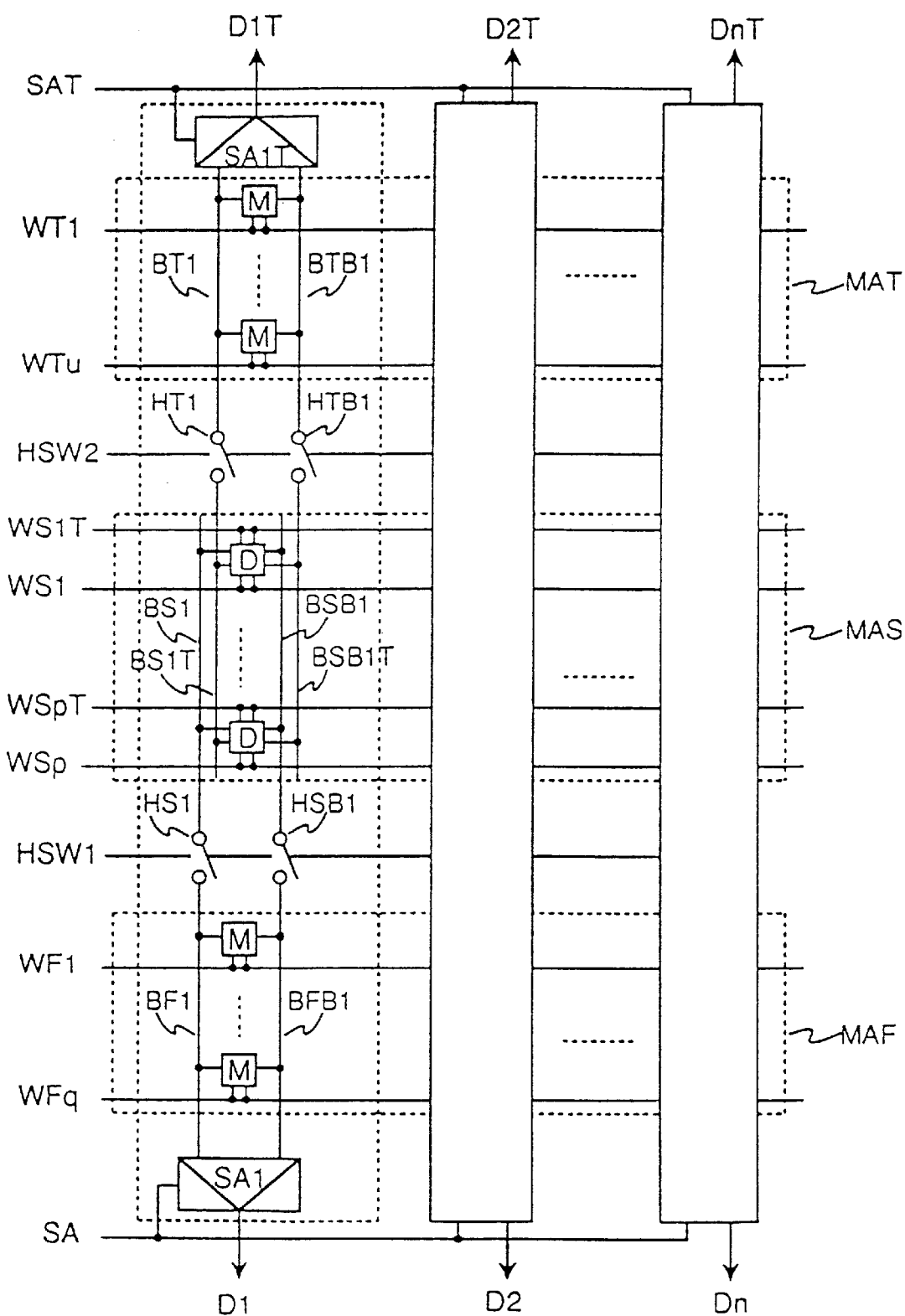
FIG. 11 is a diagram showing the construction of a memory device of a seventh embodiment of the present invention.
Figure 12:
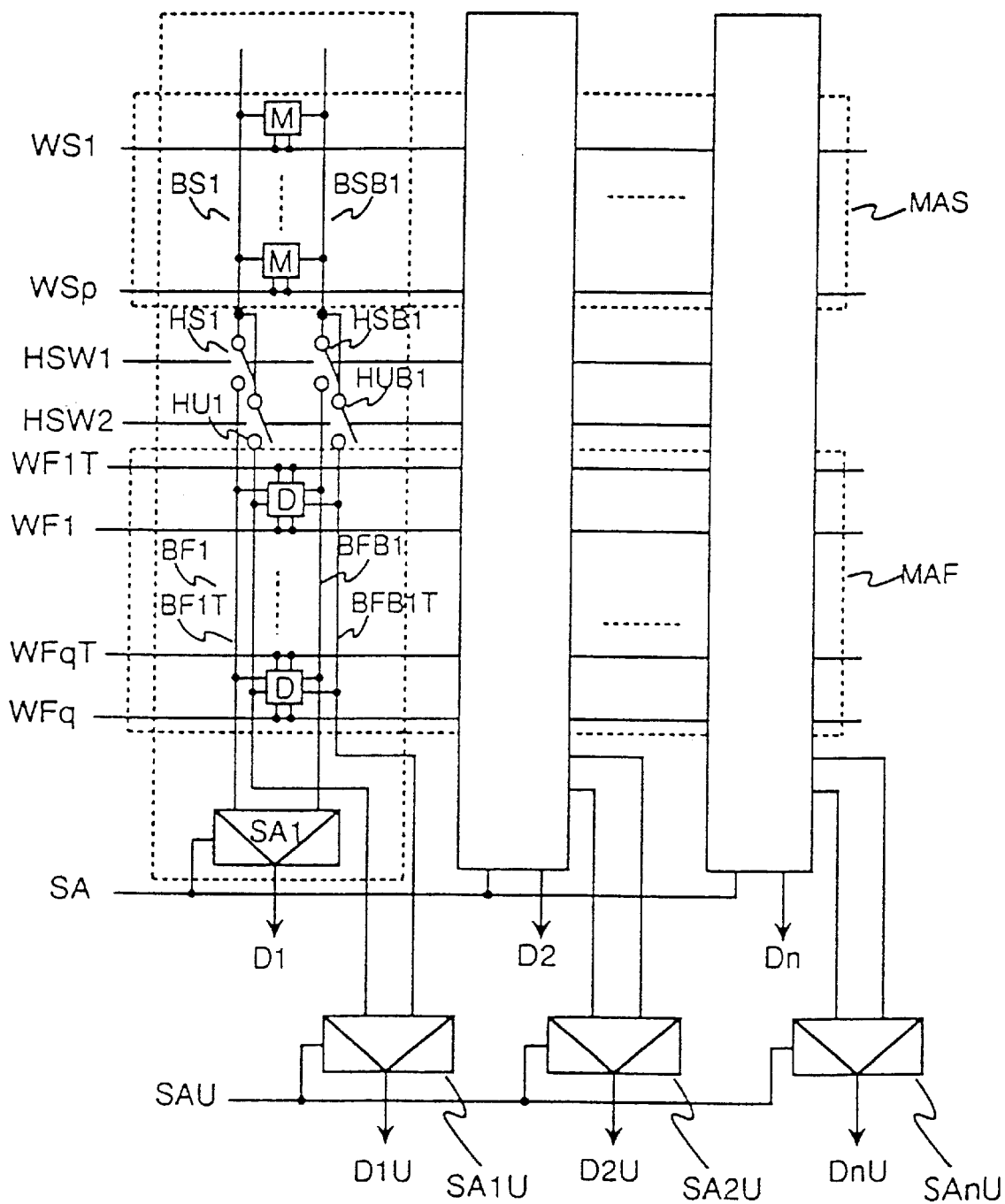
FIG. 12 is a diagram showing the construction of a memory device of an eighth embodiment of the present invention.

In the construction of a memory device according to the present invention, the bit lines of two or more memory cell arrays (to be specified as a first memory cell array and a second memory cell array), in which a plurality of memory cells for storing data is formed in an array configuration, are connected by hierarchy switches (which may have amplifying functions), as shown, for example, in FIG. 1. Sense amplifiers are connected to the bit lines of the first memory cell array, as also shown in FIG. 1. If the memory cell array is connected by three hierarchy switches, as shown in FIG. 9, a sense amplifier may be connected to the bit lines of a third memory cell array (MAT), as shown in FIG. 10. As shown in FIG. 11, on the other hand, the memory cells of the second memory cell array may be exemplified by dual port memory cells. Likewise, the memory cells of the first memory cell array may be exemplified by dual port memory cells, as shown in FIG. 12. Also, as the application may be, the second memory cell array may include the content of the first memory cell array or the third memory cell array.

A portion of the memory cells (i.e., the memory cells in a memory cell array MAF in FIG. 1) can be read out faster than the others (i.e., the memory cells in a memory cell array MAS in FIG. 1). The data that is read with high frequency can be selectively read out faster if it is stored in the memory cell array MAF. If the memory cells are operated at a voltage as low as 1.0 V, for example, a high speed reading can be realized even if MOS (Metal-Oxide-Semiconductor) transistors are used with their high threshold voltage being unchanged.

Also, as a natural consequence, the power consumed for accessing the memory cells in the memory cell array MAF can be made lower than that for accessing the memory cells in the memory cell array MAS. Thus, the effective power consumption, when considering the access frequency, can be efficiently reduced. The circuit necessary for this type of hierarchy connection is relatively insubstantial, and may be as simple as a hierarchy switch so that a large increase in the circuit scale is unnecessary.

Figure 6:
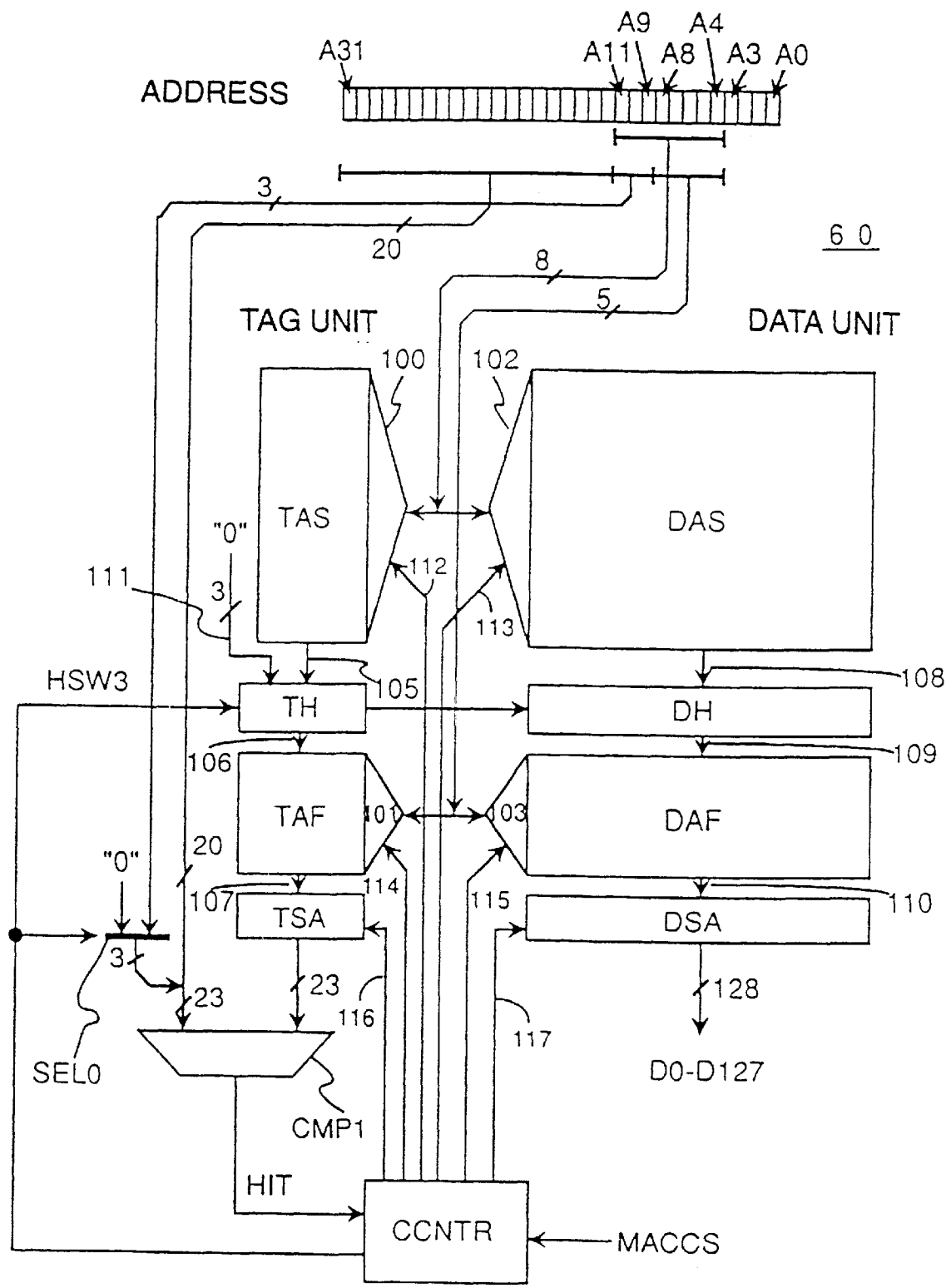
FIG. 6 is a diagram showing the construction of a memory device of a third embodiment of the present invention.

Other considerations of the present invention are apparent, as follows. If the data in the memory cell array MAS is made to include the data in the memory cell array MAF, memory cell array MAF can be used as the cache memory in the memory cell array MAS. If the data that is read with high frequency among the data of the memory cell array MAS is stored in the memory cell array MAF, the speed can be effectively raised to reduce the power consumption. Further, if the semiconductor memory device of the present invention is used as a cache memory, as shown in FIG. 6, memory cell arrays TAF and DAF can be operated as the cache memories of memory cell arrays TAS and DAS, to realize the cache memory which is constructed of a level 1 cache memory (of the memory cell arrays TAF and DAF) and a level 2 cache memory (of the memory cell arrays TAS and DAS).

Still further, if the bit lines of FIG. 1 are connected in a hierarchy of three levels, as shown in FIG. 9, the reading of the memory cell array MAF can be made faster than that of the readings of the memory cell arrays MAS and MAT. Moreover, the memory cell array MAS can be read out faster than the memory cell array MAT. A high speed reading can be realized if the data of higher access frequency is stored in the memory cell array MAF or the memory cell array MAS. The power consumption is made lower in the order of the memory cell array MAF, the memory cell array MAS and the memory cell array MAT, with the access to the memory cell array MAT being the slowest.

As shown in FIGS. 10 and 11, moreover, a dual port structure can be made if the data in the memory cell array MAS is given in the inclusive relation between the data in the memory cell array MAF and the data in the memory cell array MAT and if a sense amplifier SALT is connected to bit lines BT1 and BTB1 like bit lines BF1 and BFB1. Thus, a dual port access can be effected in a high probability by using memory cells M of single port. This can be used as the cache memory so that the dual port cache memory can be realized. The power consumption can be reduced, and the memory cell array MAF and the memory cell array MAT can be accessed at a high reading speed. Moreover, if the two ports of the dual port cache memory are connected to an instruction path and a data path, it is possible to realize a cache memory having both an instruction cache and a data cache thereby to realize the performances effectively similar to those of a separated cache by a unified cache.

Specific embodiments of the present invention will be described in the following with reference to the accompanying drawings.

First Embodiment

FIG. 1 shows the construction of a memory device of a first embodiment according to the present invention. A memory device 10, as shown in FIG. 1, is formed over a single semiconductor substrate made of single crystal silicon and is packaged in a single package by using resin (plastic) or ceramic. Incidentally, any of the memory devices of the second to tenth embodiments are also formed like the first embodiment over a single semiconductor substrate made of single crystal silicon that is packaged in a single package by using resin (plastic) or ceramic. For this reason (encapsulation), the power consumed is desirably no more than 1W or no more than 1.5 W at the maximum. If resin encapsulation is possible, the production cost and the sales price can be lowered.

The symbol M designates memory cells, and the symbols MAS and MAF designate memory cell arrays in which a plurality of memory cells are arranged in a matrix configuration. Although not especially limited, the memory cell of the present embodiment is a so-called "static type memory cell", which is constructed of: a pair of inverter circuits having cross-connected inputs and outputs; and a pair of switching means for connecting the outputs of the inverter circuits selectively to the later-described bit lines when the later-described word lines are selected. Each of the inverter circuits constituting a memory cell is composed of a driving MIS (Metal-Insulator-Semiconductor) transistor and a load element made of highly resistive polycrystal silicon or a MIS transistor, and the switching means can be composed of a transfer transistor made up of a MIS transistor. In the case of a so-called on-chip memory device formed over the same semiconductor substrate as that of a CPU (Central Processing Unit), it is preferable, from the view point of the matching properties of the manufacturing process with the transistors constituting other logic circuits to use a so-called complete CMOS memory cell which is composed of CMOS transistors formed over a semiconductor substrate. When a so-called off-chip type memory device constructed of only circuits necessary for the memory function on a chip different from that of the CPU is fabricated, it is also preferable, from the standpoint of degree of integration, to employ either a memory cell in which a high resistance resistor is used as the load element or a memory cell in which a PMOS (P-channel MOS) made of polycrystal silicon is used as the load element. For a low supply voltage of as low as 1 V, still moreover, a so-called complete CMOS memory cell is preferably used to prevent the top of the high-level potential due to the threshold voltage.

WS1 to WSp and WF1 to WFq are word lines, and in the case of an off-chip memory device, a word line (e.g., one of WS1 to WFq) is activated when the address signal AS applied from the outside of the memory device to the not-shown address input terminal is decoded by the decoder circuit DC. In the case of an on-chip memory device, the address signal AS applied to the address bus in the chip is input to the decoder circuit DC.

Moreover, bit lines BS1 to BSBn and BF1 to BFBn are constructed such that one pair of them is connected to a common memory cell. The bit lines (BS1 to BSBn) constructing the memory array MAS are selectively connected through the later-described hierarchy switches HSB1 to HSBn to the bit lines (BF1 to BFBn) constituting the memory array MAF.

To the bit line pairs BS1 to BSBn and BF1 to BFBn, although not shown, there are connected precharging means for charging the individual bit line pairs to a supply voltage level and equalizing means for shorting the individual bit line pairs to reduce their potential differences. Before the data is read, the potentials of the individual bit lines pairs are arranged so that the reading operations can be speeded up.

Since the present embodiment is so constructed that multiple bits (or n-bits) are simultaneously read out, there are (not shown) column selecting switches for controlling the connections between the individual bit line pairs and the sense amplifiers. This construction is not limiting but could be modified, when the sense amplifier is shared among a plurality of bit line pairs, such that these bit line pairs are connected to the common sense amplifier by the common data line pair thereby to select the connection of each bit line pair by the column selecting switch. Moreover, sense amplifiers SA1 to SAn are connected at their paired input terminals to a pair of bit lines. In the present embodiment, the data is read out from all the memory cells which are connected to the selected word line, so that the sense amplifiers are arranged for the individual bit line pairs. When the data is read out from the memory cells, the data of the memory cell, as connected to the selected word line, is sent through the bit line pair to the sense amplifier so that it is amplified by and output from the sense amplifier. The output of the sense amplifier is directly sent out to the output side of the memory circuit through the output terminal or through the other sense amplifier. The active/inactive state of these sense amplifiers is controlled by a sense amplifier starting signal SA so as to reduce the power consumption by the actions of the amplifiers.

On the other hand, hierarchy switches HS1 to HSn and HSB1 to HSBn are arranged between the bit lines BS1 to BSBn for the memory array MAS and the bit lines BF1 to BFBn for the memory array MAF to connect the individual bit lines selectively. The hierarchy switches are constructed, for example, of a MIS transistor, the source electrode or drain electrode of which is connected to the bit line at the side of the memory array MAS and the other of which is connected to the bit line at the side of the memory array MAF so that the later-described control signal or a hierarchy designating signal HSW1 may be applied to the gate electrode acting as a control electrode. This hierarchy designating signal HSW1 is a signal for controlling the connection between the bit lines at the memory array MAS and the bit lines at the memory array MAF. This hierarchy designating signal HSW1 is fed from the cache controller circuit CC or the like for controlling the actions of the cache memory, although not especially limitative thereto.

When the hierarchy designating signal HSW1 is asserted to turn on the individual hierarchy switches, the hierarchy switches HS1 to HSn and HSB1 to HSBn are turned on to connect the bit lines BS1 to BSn to the bit lines BF1 to BFn and to connect the bit lines BSB1 to BSBn to the bit lines BFB1 to BFBn so that the memory array MAS and the memory array MAF are connected to each other. When the hierarchy designating signal HSW1 is negated to turn off the individual hierarchy switches, the hierarchy switches HS1 to HSn and HSB1 to HSBn are turned off so that the memory array MAS and memory array MAF are disconnected from each other. The bit lines BF1 and BFB1 to BFn and BFBn of the memory cell array MAF are connected to the sense amplifiers SA1 to SAn.

The operations of the embodiment of FIG. 1 will be described in detail with reference to the timing charts of FIGS. 2(a) and 2(b).

Figure 2A:
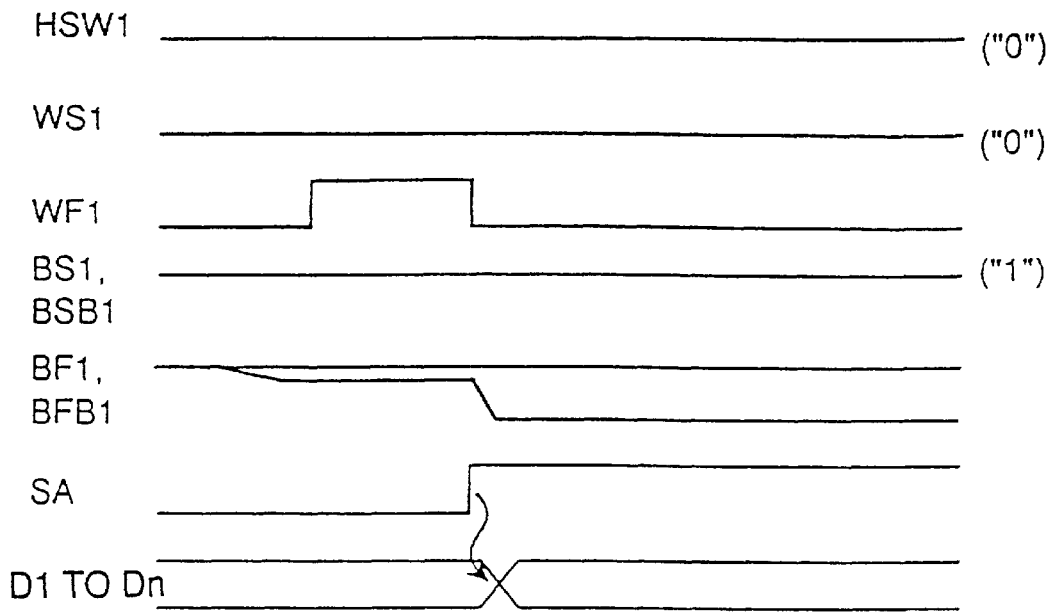
FIGS. 2(a) and 2(b) are diagrams of timing charts illustrating the operations of the memory device of the first embodiment of the present invention.

FIG. 2(a) illustrates the timing chart when the data is to be read out from the memory cell array MAF. When the data of the memory cell array MAF are to be read out, no reference is required to the data of the memory cell array MAS. Hence, the hierarchy designating signal HSW1 is negated from the beginning to turn off the individual hierarchy switches HS1 to HSBn1. Incidentally in the present embodiment, the hierarchy designating signal is negated at a logical level "0". In this status, one (e.g., the word line WF1) is selected from the word lines WF1 to WFq in the memory cell array MAF in accordance with a predetermined address signal. Incidentally, the present embodiment is constructed such that both word lines at the MAF side and the word lines at the MAS side are not simultaneously selected, but may be modified such that both word lines at the MAF side and at the MAS side are simultaneously selected, as will be described hereinafter. In the case of other than a simultaneous selection, the MAS side is selected only if the desired data is absent at the MAF side, so that the power consumption can be reduced. In the case of simultaneous selection, on the other hand, the word lines at the MAS side are already selected even if the desired data is absent at the MAF side, so that a fast reading operation can be achieved.

The memory cells, as connected to the selected word line, output their stored data to be bit line pairs because the aforementioned transfer transistors are turned on. Since the bit lines BS1 to BSBn and BF1 to BFBn are precharged before the read period to the high level or the supply voltage, the potentials of the bit lines (or the bit lines of the memory cell array MAS), as connected to the memory cells left unselected by the word lines, are held at the supply voltage (as exemplified by BS1 and BSB1 in FIG. 2).

One of the potentials of the bit lines (e.g., BF1 and BFB1 in FIG. 2) constituting the memory cell array MAF is left at the high level whereas the other is gradually lowered in accordance with the data stored in the memory cells, after the word line WF1 is selected. Next, the sense amplifier starting signal SA is asserted to cause the active status for the amplifications. When the sense amplifiers SA1 to SAn are started, the aforementioned memory cell data is amplified and output from data outputs D1 to Dn.

Figure 2B:
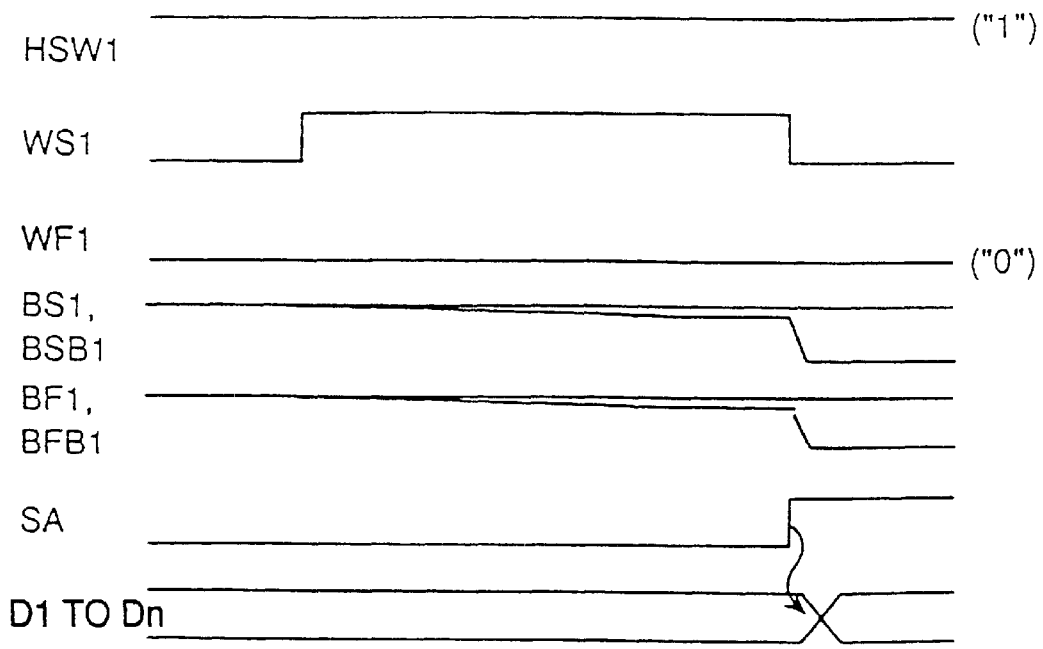

FIG. 2(b) is a timing chart for the case in which data is to be read out from the memory cell array MAS. In this case, the hierarchy designating signal HSW1 is asserted (to the logical level "1" in the present embodiment). In this status, a predetermined word line (e.g., one of the word lines WS1 to WSq in the memory cell array MAS) is selected so that the memory cell data of the selected row are read out to the bit lines BS1 and BSB1 to BSn and BSBn (e.g., BS1 and BSB1 in FIG. 2(b)). When the memory cells in the memory cell array MAS are to be selected, the word lines can be so constructed that the reading operations from the memory cell array MAS, which would take a relatively long time for driving the bit lines, can be ensured by making the time period for holding the word lines in the selected status longer than that of the case in which the memory cells of the memory cell array MAF are to be selected, as shown.

Since the hierarchy switches HS1 to HSn and HSB1 to HSBn are on, the aforementioned data is reflected upon the bit lines BF1 and BFB1 to BFn and BFBn. By starting the sense amplifiers SA1 to SAn, the aforementioned memory cell data is amplified and outputted to the data outputs D1 to Dn.

Incidentally, the description of the writing operations of the individual memory arrays will be omitted because the operations could be easily understood by considering the aforementioned writing operations. In the case of an on-chip memory device, the address input, the data input/output and the input of the control signal are executed in synchronism with the clock signal which is the timing signal of the CPU or the like.

When the data is to be read out from the memory cell array MAF, the loads of the bit lines upon the memory cells are the bit lines BF1 to BFn and BFB1 to BFBn. At the time of reading out the data from the memory cell array MAS, on the other hand, the loads of the bit lines upon the memory cells are the sum of the bit lines BS1 to BSn and BSB1 to BSBn and the bit lines BF1 to BFn and BFB1 to BFBn. As a result, the rate for reading out the data from the memory cell array MAF can be made higher than that for reading out the data from the memory cell array MAS.

The effects achieved according to the present embodiment will be described in the following comparison with a memory device of the prior art.

Figure 3:
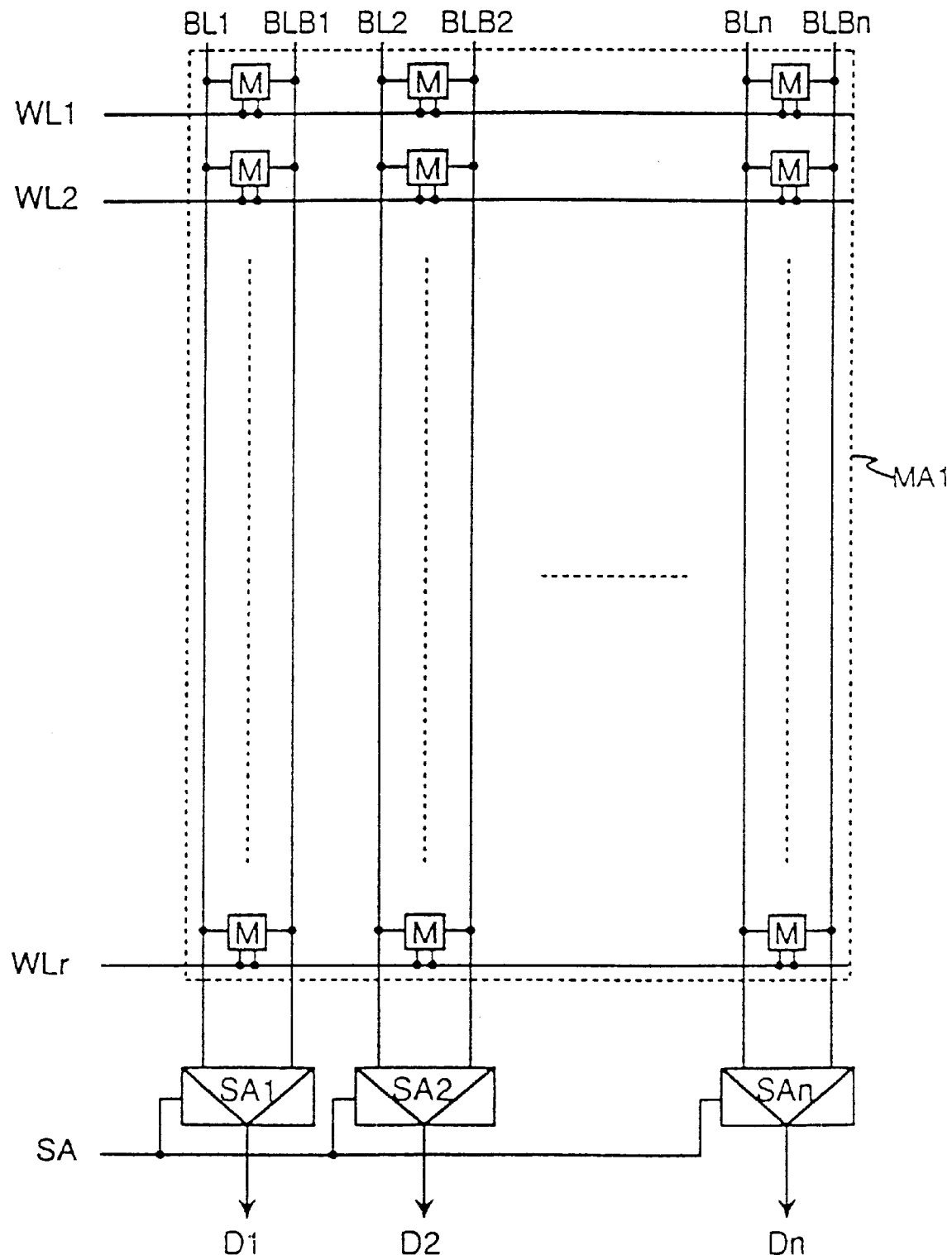
FIG. 3 is a conceptual diagram showing the construction of an ordinary memory device.

FIG. 3 is a conceptual diagram showing the construction of an ordinary memory device. It is assumed that the number of memory cells in the memory cell array MA1 of the memory device 30 is equal to that of the memory cells of the memory device 10 of FIG. 1. Hence, the number of rows of word lines WL1 to WLr is: r=p+q. The memory device has the same construction as that of the memory device 10 of FIG. 1 except that the hierarchy switches HS1 or HSn and HSB1 to HSBn are omitted. Functionally the structure is the same as the memory device 10 of FIG. 1 in which the hierarchy designating switch HSW1 is asserted. As a result, the load of the bit lines on the memory cells when the data in the memory cell array MA1 of the memory device 30 is read out is the bit lines BL1 to BLn and BLB1 to BLBn, and it is substantially equal to that of the bit lines on the memory cells. Accordingly, when the data in the memory array MAS of the memory device 10 is read out, the reading operation takes a long time.

Generally speaking, the rate of reading out the data from the memory cells is influenced by the loads, i.e., the resistances and the capacitances of the bit lines. Hence, the reading rate of the data of the memory cell array MAF can be made higher by (q+p)/q times than that of the data of the memory cell array MAS because the memory cell array MAF has q rows whereas the memory cell array MAS has p rows (FIG. 1). For example, the increase in the reading rate can be (p+q)/q=9 times if the memory cell array MAF has a q=16 rows and if the memory cell array MAS has a p=128 rows. As a result, even a memory having such a relatively high capacity that has been disabled to achieve a high speed and a low power consumption by the influences of the loads of the bit lines of the prior art can contain, in a portion thereof, memory having such a high speed and low power consumption.

Thus, by employing the embodiment of the present invention, as shown in FIG. 1, the memory cells can be constructed such that a portion thereof can be read out faster than the remaining portion. With this construction, the data to be frequently read out can be selectively read out faster than the other data if the data is stored in the memory cell array which can be read out the fastest, as compared with the others. Further, since the power consumption necessary for accessing the memory cells in the memory cell array MAF is naturally influenced by the charging/discharging of the bit line pairs and is further determined by the capacity and the access frequency of the bit lines, it can be suppressed to far less than the power consumption for accessing the memory cells in the memory cell array MAS so that the effective power consumption, in consideration of the access frequency, can be efficiently reduced.

The circuits required for the hierarchy connections are the hierarchical switches, for example, so no substantial increase in the circuit scale is required by the embodiments of the present invention.

If the data frequently read are stored in the memory cell array MAF, as described in the memory device 10 of the embodiment of FIG. 1, they can be selectively read out fast. If this effect is utilized, the memory cell array MAF can be used as the cache memory of the memory cell array MAS. When the memory cell array MAF is used as the cache memory of the memory cell array MAS, it is preferred that p>q. In other words, the number of the word lines of the memory cell array MAF is made smaller than that of the word lines of the memory cell array MAS. As a result, the bit lines BF1, BDB1 to BFn BFBn of the memory cell array MAF are made shorter than the bit lines BS1, BSB1 to BSn BSBn of the memory cell array MAS. In short, the load of the bit lines can be lessened to effect fast reading with low power consumption.

Moreover, the memory device according to the present embodiment can also be used as the so-called "on-chip cache memory" or the so-called "off-chip memory". In the case of the on-chip cache memory, generally speaking, the memory capacity is limited to about 32 Kbytes by the demand for the fast operation and the low power consumption. By adopting the present embodiment, however, it is possible to realize a cache memory which operates at high speed but with a low power consumption and which has a large capacity. It is also possible to realize a semiconductor memory, which is an off-chip memory, that has a storage capacity as high as several Mbytes and which is provided with a portion thereof that has a memory of high speed and low power consumption.

FIG. 3 is a conceptual diagram showing an ordinary memory cell construction. The number of memory cells in a memory cell array MA1 is equal to that of FIG. 1. As a result, word lines WL1 to WLr are in (r=p+q) rows. The construction is identical to that of FIG. 1 except for the absence of the hierarchy switches HS1 to HSn and HSB1 to HSBn. The construction is also functionally identical to that of FIG. 1 with the hierarchy designating signal HSW1 asserted. As a result, it takes a long time for the data in the memory cell array MA1 to be read, because the loads of the bit lines upon the memory cells are bit lines BL1 to BLn and BLB1 to BLBn. If the data that is read frequently is stored in the memory cell array MAF, as described in the embodiment of FIG. 1, it can be selectively read out fast. If this effect is utilized, the memory cell array MAF can be used as the cache memory of the memory cell array MAS.

Second Embodiment

Figure 4:
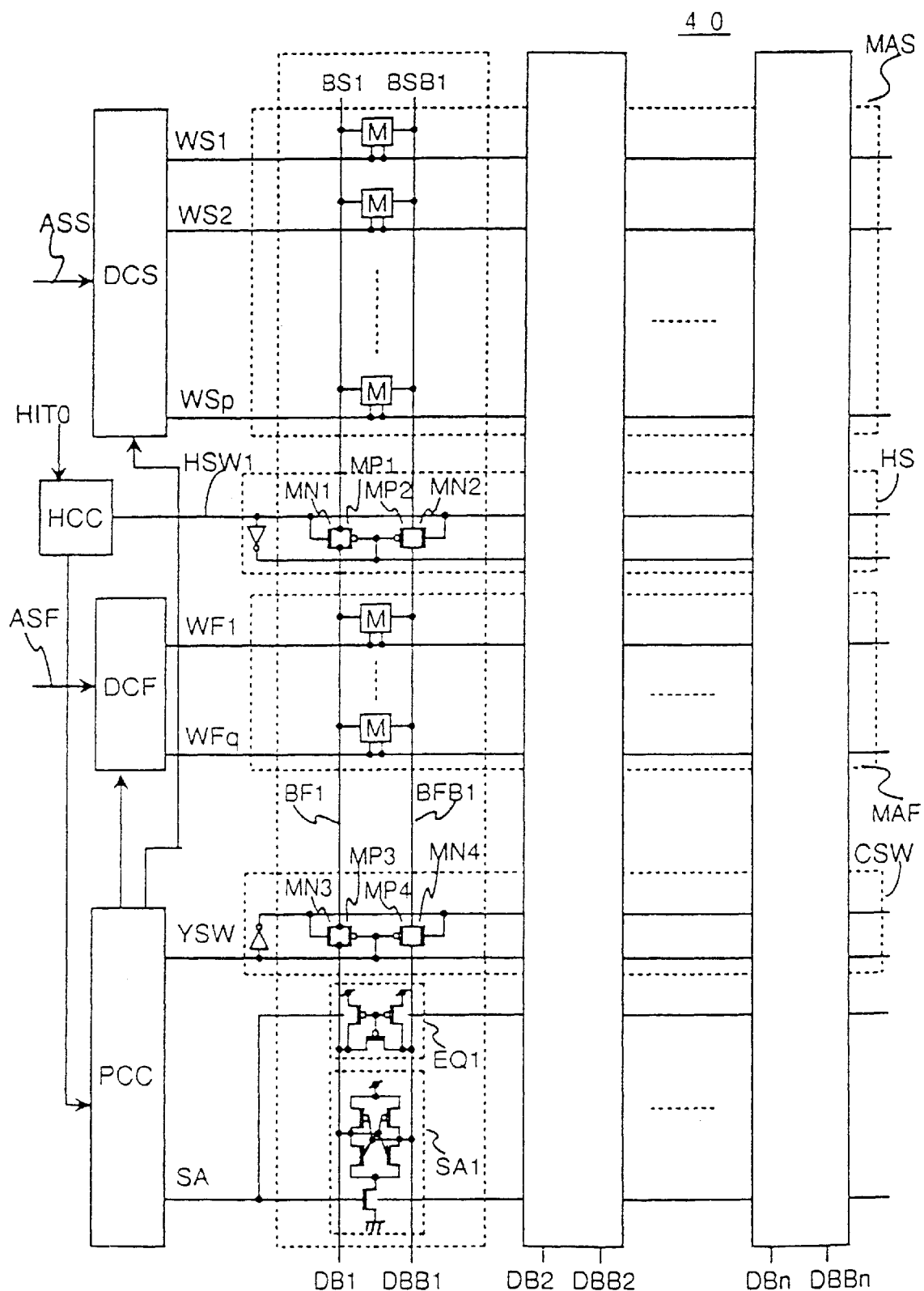
FIG. 4 is a diagram showing the construction of a memory device of a second embodiment of the present invention.

FIG. 4 shows a memory device of a second embodiment of the present invention. In the present embodiment, the memory cell array MAF of the memory device of the first embodiment is applied as a cache memory of the memory cell array MAS. Here, the description of the present embodiment that overlaps that of the first embodiment is omitted. The memory device 40 of the second embodiment can also be used as both an on-chip memory device and an off-chip memory device.

In the memory device 40: reference symbols MAS and MAF designate memory cell arrays; M memory cells; MP1, MP2, MP3 and MP4 PMOS transistors; MN1, MN2, MN3 and MN4 NMOS (N-channel MOS) transistors; WS1 to WSp and WF1 or WFq word lines; SA1 a sense amplifier circuit; SA a sense amplifier starting signal; and EQ1 an equalizer circuit. The hierarchy switch HS is constructed of a CMOS transfer gate using a PMOS transistor (e.g., MP1) and a NMOS transistor (e.g., MN1). Between the bit lines (BF1, BFB1 and so on) and the sense amplifier (SA1) constituting the memory cell array MAF, there is arranged a column selecting switch CSW for controlling their connection. This column selecting switch CSW is composed of NMOS transistors MN3 and MN4 and PMOS transistors MP3 and MP4 and is controlled by a column control signal (Y-switch signal) YSW. Moreover, the sense amplifier SA1 is of a latch type in which a pair of CMOS inverters are cross-connected and a transistor constituting a constant current source is arranged between the source region of the NMOS transistor and the earth potential, and controlled by the sense amplifier start signal SA. To the paired inputs of the sense amplifier SA1, moreover, there is connected the equalizer circuit EQ1. This equalizer circuit EQ1 is constructed of: a circuit for shorting the two inputs of the sense amplifier SA1 by the PMOS transistor in response to the control signal SA thereby to reduce the potential difference; and a circuit for precharging the potentials of the two inputs by the PMOS transistor to the supply voltage.

In the memory device 10 of the embodiment of FIG. 1, the correlation between the data in the memory cell array MAS and the data in the memory cell array MAF is not especially limited. However, since it is premised that the memory cell array MAF of the memory device 40 of the present embodiment has a construction of a cache memory, it is assumed that the data in the memory cell array MAS include the data in the memory cell array MAF. In other words, the data stored in the memory cell array MAF is likewise stored in the memory cell array MAS. Since the memory cell array MAF is used as the cache memory of the memory cell array MAS, it is assumed that p>q. In other words, the number of the word lines of the memory cell array MAF is made smaller than that of the word lines of the memory cell array MAS. As a result, the bit lines BF1, BFB1 to BFn BFBn of the memory cell array MAF are made shorter than the bit lines BS1, BSB1 or BSn BSBn of the memory cell array MAS.

The outline of the operation of the memory device 40 of the embodiment of FIG. 4 is as follows. When the data is read out, it is judged at first whether or not the data is in the memory cell array MAF by comparing the output of the not-shown tag array with the address signal by the comparator. The result of this judgment is reported to the control circuit HCC by means of the control signal JITO. If the information is in the memory cell array MAF (the result of comparison is a match), the address signal ASF is decoded by the decoder DCF, and one of work lines SF1 to WFq is asserted to read out the data. If the information is not in the memory cell array MAF (the. result of comparison is not a match) the hierarchy designating signal HSW1 is asserted (brought to a selected state) by the control circuit NCC to decode the address signal ASS by the decoder DCS. The data is read out by asserting one of the word lines WS1 to WSp and is written in the memory cell array MAF. At the data writing time, on the other hand, there can be adopted a so-called write through type, in which the hierarchy designating signal HSW1 is asserted to one of the word lines WF1 to WFq and one of the word lines WS1 to WSp to write the common data simultaneously in the memory cell array MAF and the memory cell array MAS. Generally speaking, the main memory unit (main storage unit) or the secondary cache memory unit (the memory cell array MAS of FIG. 4) is formed in a chip other than that of the primary cache memory unit (the memory cell array MAF of FIG. 4), and the writing time period of the secondary cache memory unit is far longer than that of the primary cache memory unit, so that the simultaneous writing operation increases the writing time period of the primary cache memory unit. If, however, the memory cell arrays MAF and MAS are formed over the common chip as in the present invention, the difference in the writing time period is relatively short so that the writing of aforementioned write through type can be effected.

These operations will be described in more detail with reference to the timing chart of FIG. 5.

Figure 5A:
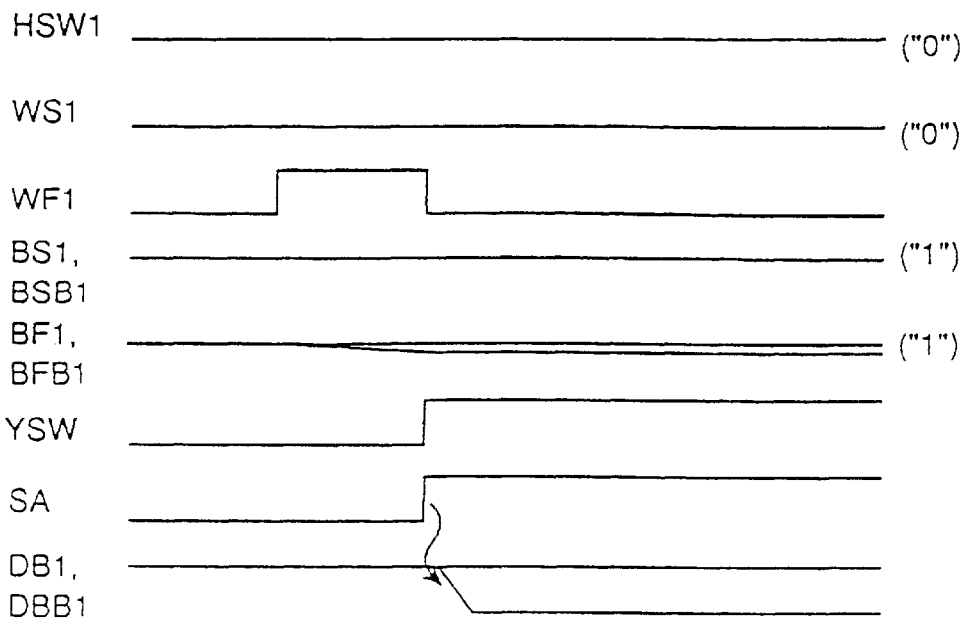
FIGS. 5(a) and 5(b) are diagrams of timing charts illustrating the operations of the memory device of the second embodiment of the present invention.
Figure 5B:
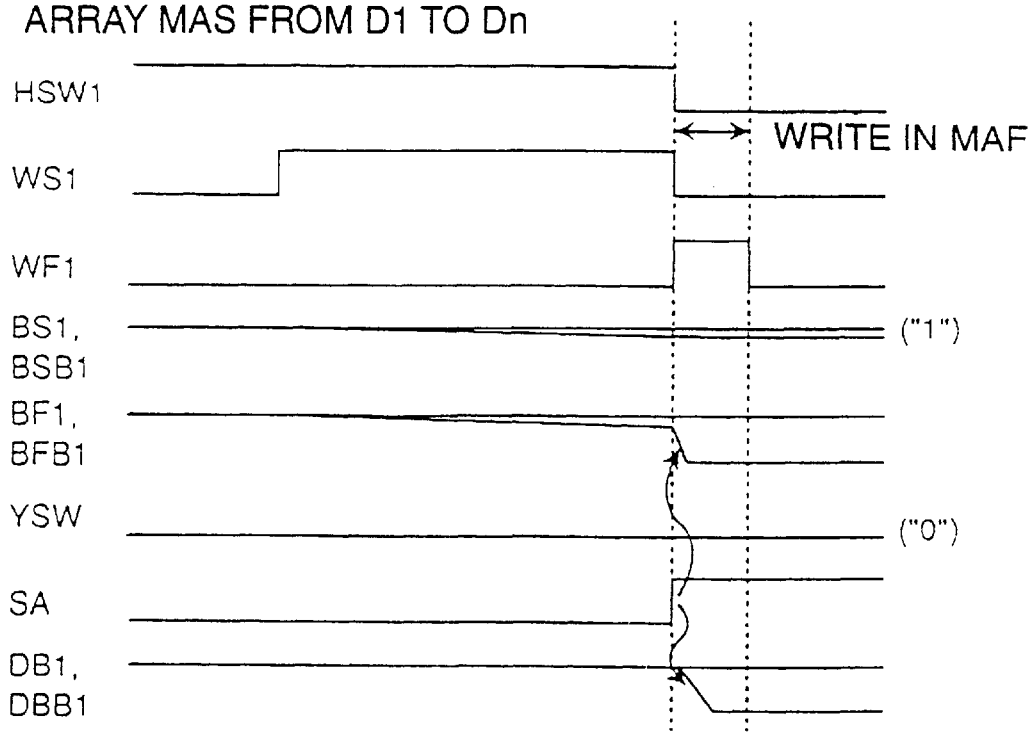

FIG. 5(*a*) illustrates a timing chart for reading out the memory cell array MAF. First of all, the hierarchy designating signal HSW1 is negated to "0". As a result, the bit lines BS1 and BSB1 constituting the memory cell array MAS are disconnected from the bit lines BF1 and BFB1 constituting the memory cell array MAF. In this status, the word lines WF1 to WFq (or the word line WF1 in FIG. 5(*a*)) are asserted to read out the data of the memory cells M to the bit lines BF1 and BFB1. When the bit lines BF1 and BFB1 are opened to about 0.1 V after lapse of a predetermined time period, the sense amplifier starting signal SA is asserted (to "1") to generate outputs DB1 and DBB1. Simultaneously with this, the Y-switch signal YSW is negated (to "1") by the control circuit PCC. Then, the bit lines BF1 and BFB1 are disconnected, but the potentials of the bit lines BF1 and BFB1 are not amplified by the sense amplifiers so that the operations of low power and high speed can be realized.

FIG. 5(*b*) illustrates a timing chart for reading out the memory cell array MAS. First of all, the hierarchy designating signal HSW1 is set to "1". As a result, the bit lines BS1 and BSB1 are connected to the bit lines BF1 and BFB1. In this status, the word lines WS1 to WSq (or the word line WS1 in FIG. 5(*a*)) are asserted to read out the data of the memory cells M to the bit lines BS1 and BSB1 and the bit lines BF1 and BFB1. When the bit lines BF1 and BFB1 are opened to about 0.1 V after lapse of a predetermined time period, the sense amplifier starting signal SA is asserted (to "1") while the Y-switch signal YSW being asserted (to "0"). Simultaneously with this, the hierarchy designating signal HSW1 is set to "0". Then, the potentials of the bit lines BS1 and BSB1 are not amplified by the sense amplifiers so that the operations are achieved in a low power consumption and at a high speed. Since the Y-switch signal YSW remains asserted, the content, as read out from the memory cell array MAS, is amplified to the bit lines BF1 and BFB1. Thus, the writing of the memory cell array MAF can be executed if one of the word lines WF1 to WFq (or the word line WF1 in FIG. 5(*b*)) is asserted. If the memory cells M can be written by bit lines of small amplitude, the sense amplifiers can be lowered in power consumption and speeded up in operation by negating the Y-switch signal YSW (to "1") and subsequently by asserting the sense amplifier starting signal SA (to "1").

Since the data read out from the memory cell array MAS are thus written in the memory cell array MAF, the data of high using frequency in the memory cell array MAS are also stored in the memory cell array MAF. As a result, the probability of high speed reading merely by accessing the memory cell array MAF can be raised to perform the reading operations accordingly at a high speed and in a low power consumption.

As shown in FIGS. 5(*a*) and 5(*b*), the content of the memory cell array MAS is written in the memory cell array MAF by asserting the word line WF1. If the arrangement is such that the row which is used least in the memory cell array MAF is written, the probability (or hit ratio) at which the data to be read out is present in the memory cell array MAF can be raised to achieve the higher speed operation with lower power consumption.

The memory cell array MAF of the memory device 20 can be used as the primary cache memory, and the memory cell array MAS can be used as the secondary cache memory or the main memory. In the case of an on-chip cache memory, generally speaking, the memory capacity is limited to about 32 Kbytes by the requirement for the high speed operation and the low power consumption. By adopting the present embodiment, however, if the memory capacity of the memory array MAF of the primary cache memory is set to 32 Kbytes or less, it is possible to realize a memory device (e.g., a cache memory alone, or both a cache memory and a main memory) having a capacity of 256 Kbytes or 1 Mbyte (capable of having a capacity of more than 1 Mbyte depending on the scale of the logic circuit and the microminiaturizing technique). As an off-chip memory device, moreover, it is possible to realize a semiconductor memory which has a storage capacity of as high as several Mbytes and which is provided with a portion thereof having establishing memory of high speed and low power consumption.

Third Embodiment

FIG. 6 shows a third embodiment of the present invention, which embodies a cache memory equipped with a tag array in addition to the embodiment of FIG. 4. This tag array stores a portion of the address signal that corresponds to the data of each row of the data unit. Whether or not a hit has occurred is decided by comparing the stored content with the address signal. For simplicity, FIG. 6 shows a direct mapped structure in which the tag unit and the data unit (of one row) are selected by an index. Similar effects can apparently be achieved with a set associative structure or a full associative structure, as will be described hereinafter. In FIG. 6, too, the memory cell arrays and the hierarchy switches are similar to those of the first and second embodiments so that their repeated description will be omitted. The memory device 60 of the third embodiment is also used as an on-chip memory device and an off-chip memory device.

In the memory device 60: reference symbols TAS, TAF, DAS and DAF designate memory cell arrays; TH and DH hierarchy switches; TSA and DSA sense amplifiers, CMP1 a 23-bit comparator; 100, 101, 102 and 103 decoders; and 105, 106, 107, 108, 109 and 110 bit lines. The tag units TAS and TAF, the hierarchy switch TH, the sense amplifier TSA, the data units DAS and DAF, the hierarchy switch DH and the sense amplifier DSA correspond to the elements MAS, MAF, HS1 and HSBn and SA1 to San of the memory devices in FIGS. 1 and 4, respectively.

The memory cell arrays MAS and TAF constitute the tag unit, and the memory cell arrays DAS and DAF constitute the data unit. The memory cell array TAS has a data width of 20 bits, and the memory cell array TAF has a larger data width of 23 bits than that of the memory cell array TAS. This is because the memory cell arrays TAF and DAF have smaller storage capacities and require a smaller number of indexes than those of the memory cell arrays TAS and DAS (the indexes of the memory cell arrays MAF and DAF are of 8 bits whereas the indexes of the memory cell arrays TAS and DAS are of 5 bits), and therefore the address data width has a difference. As a result, the bit line 105 corresponds to 20 bits. The bit line 106 is connected to the hierarchy switch TH together with the bit line ill fixed at the "0" level, and it corresponds to 23 bits. For the remaining 3 bits, therefore, when the hierarchy designating signals HSW3 is asserted, a similar signal fixed at the "0" level is inputted to the comparator CMP1, as described later, so that no substantial comparison is executed.

FIG. 6 schematically shows at its upper portion the construction of the addresses to be used in the present embodiment. In the case of an on-chip memory device, the address is fed from the CPU or the like in the chip. In the case of an off-chip memory device, the address is fed from the outside of the chip. Addresses A0 to A31 are of 32 bits. The index which is the addresses for selecting one row from the tag unit and the data unit is of 8 bits (256 rows) from address A4 to address A11 for the memory cell arrays TAS and DAS, and of 5 bits (32 rows) from address A4 to address A8 for the memory cell arrays TAF and DAF. The line size is 128 bits (16 bytes). Hence, the number of bits of the memory cell arrays TAF and DAF is one eighth of the number of bits of the memory cell arrays TAS and DAS.

A 3-bit selector circuit SELO selects and outputs 3 bits of the addresses A9 to A11 when a hierarchy designating signal HSW3 is negated. When this hierarchy designating signal HSW3 is asserted, the selector circuit SELO outputs "0" of 3 bits. The output of this selector and the 20 bits of the addresses A12 to A31 are input together to the comparator CMP1.

The memory cell arrays TAF and DAF are operated as the cache memories of the memory cell arrays TAS and DAS. The memory device 60 of FIG. 6 has a construction similar to that of the cache memory which is provided with the primary cache memory (the memory cell arrays TAF and DAF) and the secondary cache memory (the memory cell arrays TASD and DAS). The primary cache memory and the secondary cache memory are controller by the control circuit CCNTR.

These reading operations will be described in detail with reference to the flow chart of FIG. 7.

First of all, in step 70, the hierarchy designating signal HSW3 is negated in advance (to turn off the hierarchy switches TH and DH). Next, in step 71, the addresses A4 to A11 are decoded by the decoders 100 and 102 to select one row of the memory arrays TAS and DAS. Simultaneously with this, the addresses A4 to A8 are decoded by the decoders 101 and 103 to select one row of the memory cell arrays TAF and DAF. When the data of the selected memory cells are read out to the bit lines 107 and 110 in accordance with the selected word lines, the sense amplifiers TSA and DSA are started to amplify the data (step 72). Next, in step 73, the data of the tag unit, as read out by the sense amplifier TSA, and the addresses A9 to A31 are compared by the comparator CMP1. If this comparison result reveals the answer CORRESPONDING, the reading operations are ended. In this case, the necessary data is present in the memory cell array DAF corresponding to the level 1 cache memory and the data can be read out at a high speed.

If the result of the comparison in step 73 results in NOT CORRESPONDING, the sense amplifiers TSA and TDA are negated in step 74 to negate the outputs of the decoders 101 and 103 (step 75) thereby to inactivate the memory cell arrays TAF and DAF. The sense amplifiers TSA and TDA and the decoders 101 and 103 are controlled by the control signal based on the HIT signal or the output of the comparator, although not especially limiting thereto. Next, the hierarchy designating signal HSW3 is asserted in step 76 so that the data of the memory cells, as selected by the decoders 100 and 102 in the memory cell arrays TAS and DAS, are read out to the bit lines 105 and 108. Since the hierarchy switches TH and DH are on, the data is reflected upon the bit lines 106, 109, 107 and 110. Since, at this time, the capacitances of the bit lines 105 and 108 are sufficiently higher than those of the bit lines 106, 109, 107 and 110, the data of the bit lines 105 and 108 are reflected as they are upon the bit lines 106, 109, 107 and 110 by the capacitance division. As a result, the bit lines 106, 109, 107 and 110 need not be equalized in advance so that the time period necessary for the equalizing operations can be omitted. It is quite natural that the bit lines 106, 109, 107 and 110 can also be equalized in advance if the capacitances of the bit lines 105 and 108 are not sufficiently high and if the bit lines 106, 109, 107 and 110 have to be charged/discharged with margins.

Next, the sense amplifiers TSA and DSA are started in step 77 until the data of the tag unit, as read out by the sense amplifier TSA, and the addresses A12 to A31 are compared by the comparator CMP1 (step 78). If this comparison result provides a NOT CORRESPONDING determination, it is treated as a miss. If the determination is CORRESPONDING, the outputs of the decoders 101 and 103 are asserted again in step 79 to write the read contents of the memory cell arrays TAS and DAS in the memory cell arrays TAF and DAF.

Figure 7:
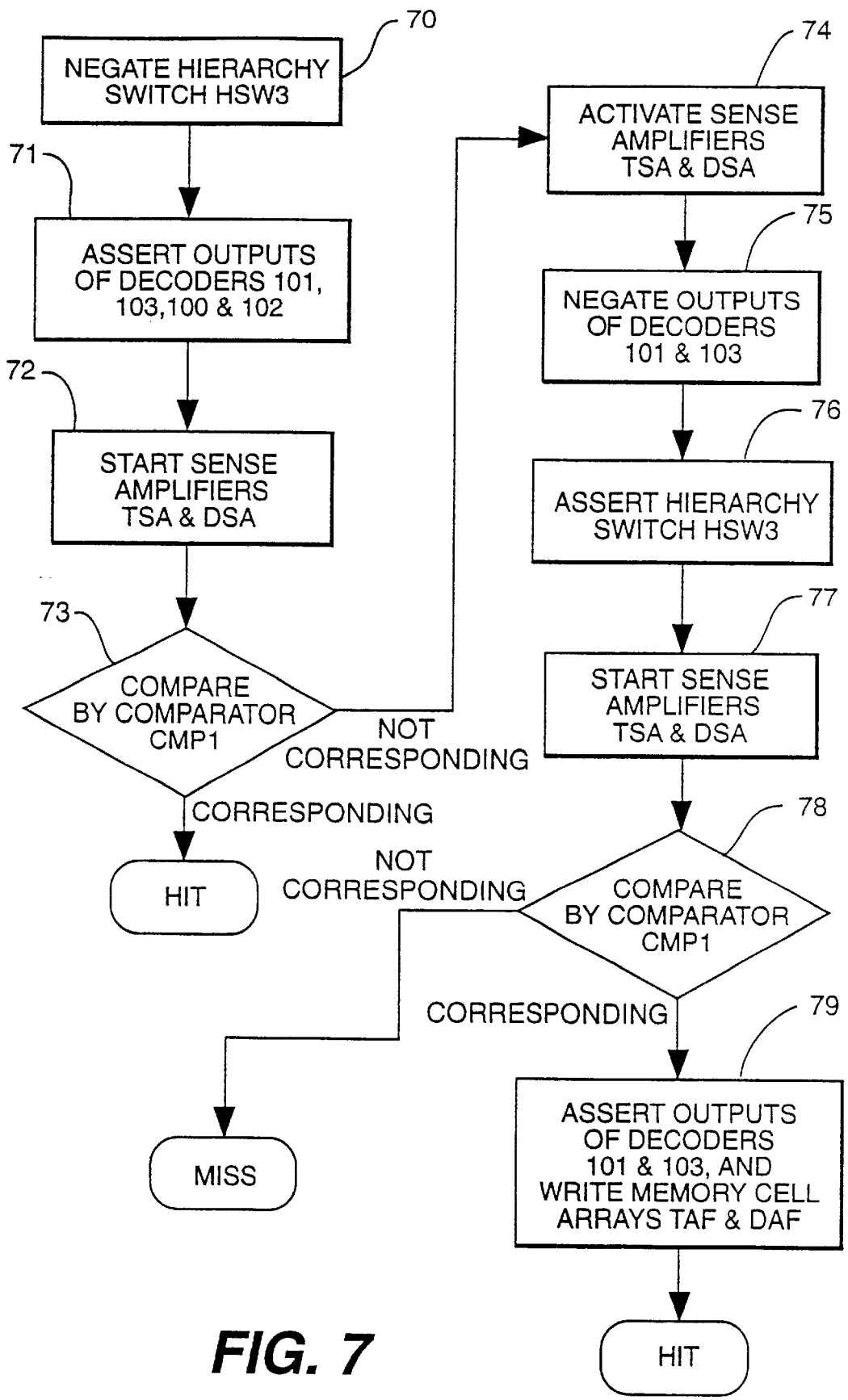
FIG. 7 is a diagram of a flow chart illustrating the operations of the memory device of the third embodiment of the present invention.

Although the outputs of the decoders 101 and 103 and the outputs of the decoders 100 and 102 are simultaneously asserted at first in FIG. 7, only the outputs of the decoders 101 and 103 may be asserted at first, and the outputs of the decoders 100 and 102 may be asserted after the first comparison of the comparator outputs the NOT CORRESPONDING detection. In this case, the decoders 100 and 102 can be controlled by utilizing the HIT signal or the output of the comparator. According to the construction in which the outputs of the decoders 101 and 103 and the outputs of the decoders 100 and 102 are simultaneously asserted, a fast reading operation can be achieved, because the outputs of the decoders 100 and 102 are already asserted even if the comparison result is NOT CORRESPONDING. At the same time, according to the construction of no assertion, the power consumption can be reduced because the decoders 100 and 102 are asserted only in the case of the NOT CORRESPONDING result. Moreover, the construction to be adopted may be changed, for example, depending upon the operation speed of the system using the semiconductor memory device of the present invention. The demands for the high speed operation and the low power consumption of the system can be concurrently realized by performing the simultaneous assertions in the fast operation status (or mode) of the CPU and not in the slow status (or mode).

As an alternative arrangement to the memory device shown in FIG. 6, the hierarchy switch TH between the tag arrays TAS and TAF may be eliminated. However, the hierarchy switch DH would be provided for the bit lines between data unit arrays DAF and DAS. The tag units TAS and TAF would be connected to a comparator through appropriate sense amplifiers and would determine whether a hit occurs in data unit DAF or data unit DAS. The hierarchy switch between the tag units TAS and DAF might be considered unnecessary in some applications since these memories have small capacity as opposed to the memory for the data units. The function performed by the modified arrangement would be similar in that if a hit occurs in the data unit DAF, the hierarchy switch DH, which would be initially negated, would remain negated in order to allow fast data access. On the other hand, if a miss occurs, the hierarchy switch DH would be turned on to allow access of the data in data unit DAS.

Fourth Embodiment

Figure 8:
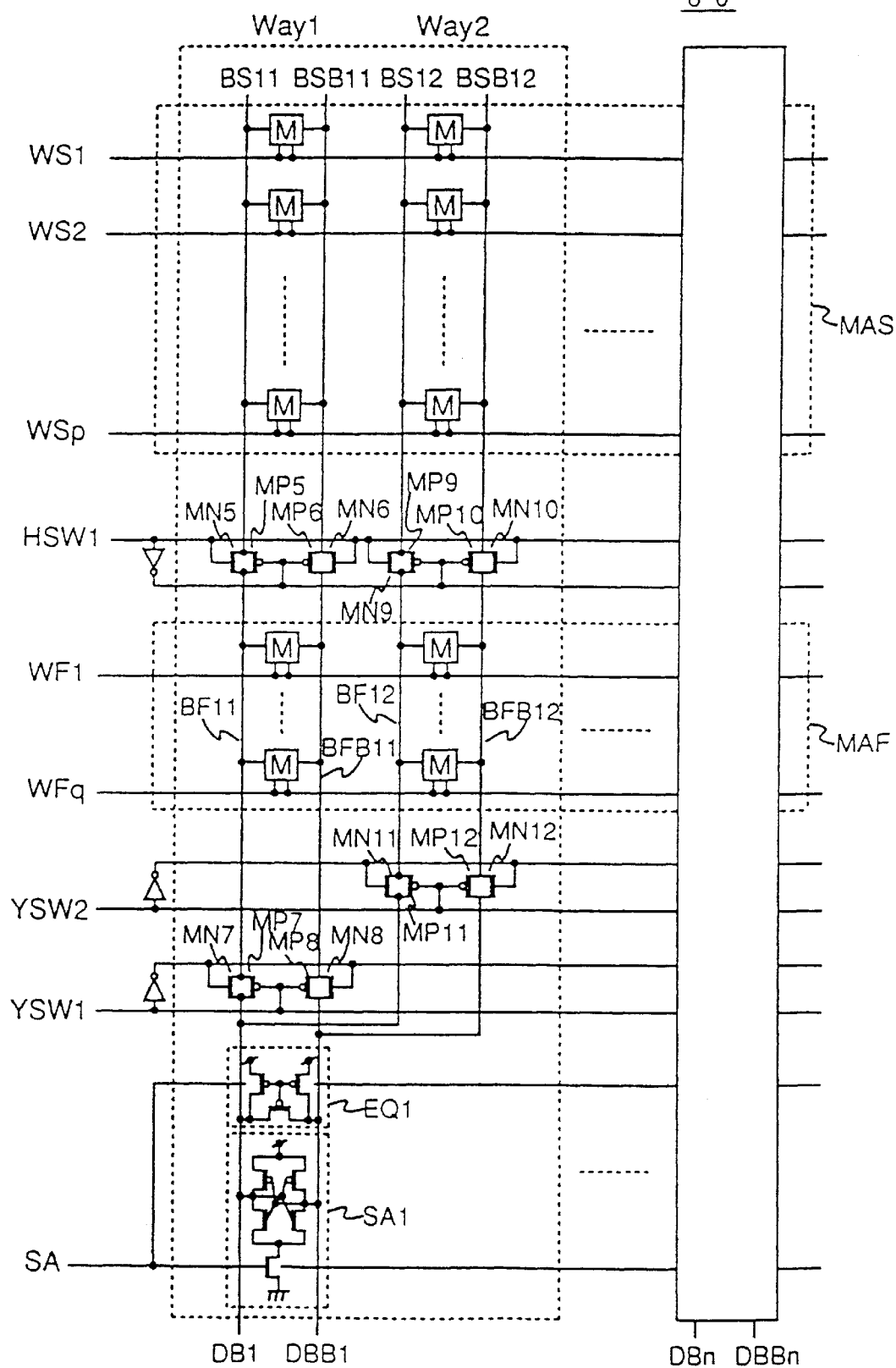
FIG. 8 is a diagram showing the construction of a memory device of a fourth embodiment of the present invention.

FIG. 8 shows a fourth embodiment of the case in which the memory device of FIG. 6 is given a two-way set associative structure. For the convenience of describing the embodiment of FIG. 8, the construction of the data unit is explained as a cache memory. In this two-way set associative structure, two tags and data is selected by a single index, and the two tags are concurrently compared so that the data corresponding to the coincident tags may be output. The not-shown tag unit or the like is constructed such that the tags and so on, as shown in FIG. 6, are arranged in two sets. Accordingly, the description of the portions similar to those of the foregoing embodiments will be omitted. The memory device 80 of the fourth embodiment may also be used as an on-chip memory device or an off-chip memory device.

In the memory device 80, the memory cells connected to bit lines BS11 and BSB11, and BF11 and BFB11 are in a way 1 (Way1), and the memory cells connected to bit lines BS12 and BSB12, and BF12 and BFB12 are in a way 2 (Way2). The bit line pair constituting the way 1 and the bit line pair constituting the way 2 are desirably arranged close to each other because they are commonly connected to the sense amplifier, and are alternately arranged in the present embodiment. Memory 80 is different from the memory device 40 of FIG. 4 in that two Y-switches constructed of NMOS transistors MN7, MN8, MN11 and MN12 and PMOS transistors MP7, MP8, MP11 and MP12 are connected to the common equalizer EQ1 and sense amplifier SA1. The way 1 is selected, when the Y-switch signal YSW1 is asserted (to "0"), and the way 2 is selected when the Y-switch signal YSW2 is asserted (to "0"). Here, the way selector is exemplified by the Y-switches, but a higher speed reading operation can be achieved by adopting a method in which the sense amplifier is disposed in each way and the way selector is disposed on the downstream side of the sense amplifier.

FIG. 8 shows an example of a two-way set associative structure, but the present invention can also be likewise realized by a four-way set associative structure or the like. Incidentally, since the memory cell array MAA is used as the cache memory of the memory cell array MAS, p>q. In other words, the number of the word lines of the memory cell array MAF is made smaller than that of the word lines of the memory cell array MAS. As a result, the bit lines BF11, BFB11, BF12 and BFB12 of the memory cell array MAF are made shorter than the bit lines BS11, BSB11, BS12 and BSB12 of the memory cell array MAS.

Reading operations with the embodiment of FIG. 8 can be accomplished by a method similar to that of FIG. 4 except for the use of the Y-switch of the selected way. When the content, as read out from the memory cell array MAS, is to be written in the memory cell array MAF, it may be written in the same way as the way it is read out or in another way, as selected. The writing operations may also be executed by using the Y-switch of the way to be expelled, as determined in accordance with a replace algorithm such as the LRU (Least Recently Used) algorithm in which the data to be written is written in the oldest used one of the plurality of ways. In addition, reading and writing algorithms of various modes can be adopted, and the optimum algorithm may be adopted mainly according to the number of ways. This adoption is desirably made to raise the hit ratio as the cache memory and, if possible, the hit ratio of the memory cell array MAF.

Fifth Embodiment

FIG. 9 is a diagram showing a fifth embodiment of the present invention, in which the hierarchy of the bit lines of FIG. 1 are three-level. The description of the portions similar to those of the first embodiment will be omitted. The memory device 90 of the fifth embodiment is also used as an on-chip memory device or an off-chip memory device.

Unlike the memory device 10 of FIG. 1, in the memory device 90, there are further connected hierarchy switches HT1 and HTB1, bit lines BT1 and BTB1 and a memory cell array MAT. The rate of reading data from the individual hierarchies is determined according to the number (u) of word lines WT1 to Wtu, the number (p) of the word lines WS1 to WSp and the number (q) of the word lines WF1 to WFq. The memory cell array MAF can be read out faster than the memory cell arrays MAS and MAT. Moreover, data in the memory cell array MAS can be read out faster than those in the memory cell array MAT. High speed reading can be realized if the data to be accessed frequently is stored in the memory cell array MAF or the memory cell array MAS. The power consumption can also be reduced for the same reason as that described in connection with the memory device 10 of the embodiment of FIG. 1.

Moreover, it is apparent that the second to fourth embodiments, as shown in FIGS. 4 to 8, can also be realized with a construction of the three-level hierarchy of FIG. 9 to provide similar effects. In such a case, the relation among the numbers of word lines would be u>p>q.

Sixth and Seventh Embodiments

FIGS. 10 and 11 are diagrams showing sixth and seventh embodiments of the present invention and the applications of the three-level structure shown in FIG. 9. It is assumed in FIGS. 10 and 11 that the data in the memory cell array MAS includes the data in the memory cell array MAF and the data in the memory cell array MAT. In other words, since the memory device is used as a cache memory (a premise for clarifying the description of the embodiment, but not limited thereto), the data, as stored in the memory cell arrays MAT and MAF, is also duplicated and stored in the memory cell array MAS, in which is stored other data. The memory device 1000 of the sixth embodiment and the memory device 1100 of the seventh embodiment can be used as an on-chip memory device or an off-chip memory device.

In the memory devices shown in FIGS. 10 and 11, a sense amplifier SA1T is connected to the bit lines BT1 and BTB1 like the bit lines BF1 and BFB1 to output data outputs DAT1 and DATnT so that the two output reading lines are provided to have dual ports. With this construction, the memory can be read out and written in from the two independent lines. The reading/writing operations of the memory cell arrays MAT and MAS can be effected by using the method for the memory cell arrays MAF and MAS, as has been described with reference to FIG. 1, as it is.

In the memory device 1000 of FIG. 10, however, the writing of the memory cell array MAS and the reading of the memory cell array MAS and the reading of the memory cell array MAS cannot be simultaneously performed from both the data outputs D1 to Dn and the data outputs D1T to DnT. However, this access collision raises no practical problem, because the access to the memory cell array MAS rarely occurs if it is considered that the access will not arise so long as the desired data is in the memory cell array MAF or MAT. If the access collision occurs, it is detected, and access to both the data outputs D1 to Dn and the data outputs D1T to DnT is made sequentially. Because of the low probability of the access collision, the dual port access can be effected at a high probability by using the single port memory cells M. Since the dual port access can be made, even a processor having two arithmetic units such as an ALU (Arithmetic Logic Unit) can construct data cache memories corresponding to the individual arithmetic units so that it can easily cover its concurrent operations. In short, by using the single port memory cells, the dual port semiconductor memory device or cache memory can be realized at a high speed with a low power consumption.

The memory device 1100 of FIG. 11 is an embodiment in which the dual ports can be accessed even when the aforementioned access collision occurs.

The memory cells M in the memory cell array MAS of FIG. 10 are replaced by dual port memory cells D. These dual port memory cells D have ports connected to the bit lines BS1 and BSB1 to be controlled by the word lines WS1 to WSp, and ports connected to the bit lines BS1T and BSB1T to be controlled by the word lines WS1T to WSpT. These dual ports can be concurrently accessed even with the aforementioned access collision if the word lines WS1 to WSp are used for the accesses from the data outputs D1 to Dn and if the word lines WS1T to WSpT are used for the accesses from the data outputs D1T to DnT.

Eighth Embodiment

FIG. 12 shows a memory device of an eighth embodiment in which the memory cell array MAF of FIG. 1 is modified to have dual ports. The description of the portions similar to those of the memory device 10 of the first embodiment will be omitted. The memory device 1200 of the eighth embodiment can also used as an on-chip memory device or an off-chip memory device. Since the dual port memory cells have an element area 1.5 to 2 times larger than that of the ordinary memory cells, a memory permitting dual port access while suppressing the increase in the circuit area can be realized by using the dual port cells only in the memory cell array MAF having a high access frequency, as in the present embodiment.

The memory cell array MAF has two pairs of bit lines BF1 to BFn and BFB1 to BFBn, and BF1T to BFnT and FFB1T to BFBnT. To these bit line pairs, there are connected the sense amplifiers SA1 to SAn and SA1U to SAnU. In FIG. 12, the bit lines BF1 and BFB1 are connected to the bit lines BS1 and BS1B through the hierarchy switches HS1 and HSB1, and the bit lines BF1T to BFnT and BFE1T to BFBnT are connected to the bit lines BS1 and BS1B of the memory cell array MAS through hierarchy switches HU1 to HUn and HUB1 to HUBn. Moreover, the hierarchy switches HS1 to HSn and HSB1 to HSBn are controlled by the hierarchy designating signal HSW1, and the hierarchy switches HU1 to HUn and HUB1 to HUBn are controlled by a hierarchy designating signal HSW2.

If the data stored in the memory cell array MAS is made to include the data stored in the memory cell array MAF, as described before, the access frequency of the memory cell array MAF is higher than that of the memory cell array MAS. Because of the locality of the memory access, most accesses are made to the memory cell array MAF having the dual port structure. Since the capacity of the memory cell array MAF can be suppressed, the increase in the area due to the multi-port memory cells can be suppressed. Especially when the concurrent accesses to the multi-port memory are localized, the frequency of accessing to the memory cell array MAS is reduced to improve the efficiency.

As an extreme example of FIG. 12, there is the example in which the memory cell array MAF has only one row (indicating q=1). This example can achieve a sufficient effect if the concurrent accesses to the multi-port memory occurs at adjacent addresses. Moreover, a sense amplifier having a function similar to that of the switch may be interposed between the memory cell array MAS and the memory cell array MAF of FIG. 12. In other words, the hierarchy switches HS1 and HSB1, and HU1 and HUB1 may be replaced by sense amplifiers. The memory cell array MAF acts as the multi-port buffer of the semiconductor memory which is constituted by the memory cell array MAS.

In the embodiments of FIG. 10 and FIG. 12, it is worthwhile to mention that the increase in the reading rate and the reduction of the power consumption can be effected by making the capacities of the memory cell arrays MAF and MAT lower than that of the memory cell array MAS.

The embodiments of FIGS. 10 to 12 can be applied to the embodiments of the cache memory of FIGS. 6 to 8 to realize the dual port cache memory. The power consumption can also be reduced for the very same reasons as those described in connection with the embodiment of FIG. 1. As to the reading rate, too, the accesses to the memory cell array MAF and the memory cell array MAT can be effected at high speed for the same reasons as those described in connection with the embodiment of FIG. 1. Moreover, this dual port cache memory can be used as a cache memory acting as both an instruction cache and a data cache if its two ports are connected to the instruction path and the data path. Effectively, a performance like that of a separated cache (in which the instruction cache and the data cache exist separately of each other) can be realized by a unified cache.

Ninth Embodiment

Figure 13:
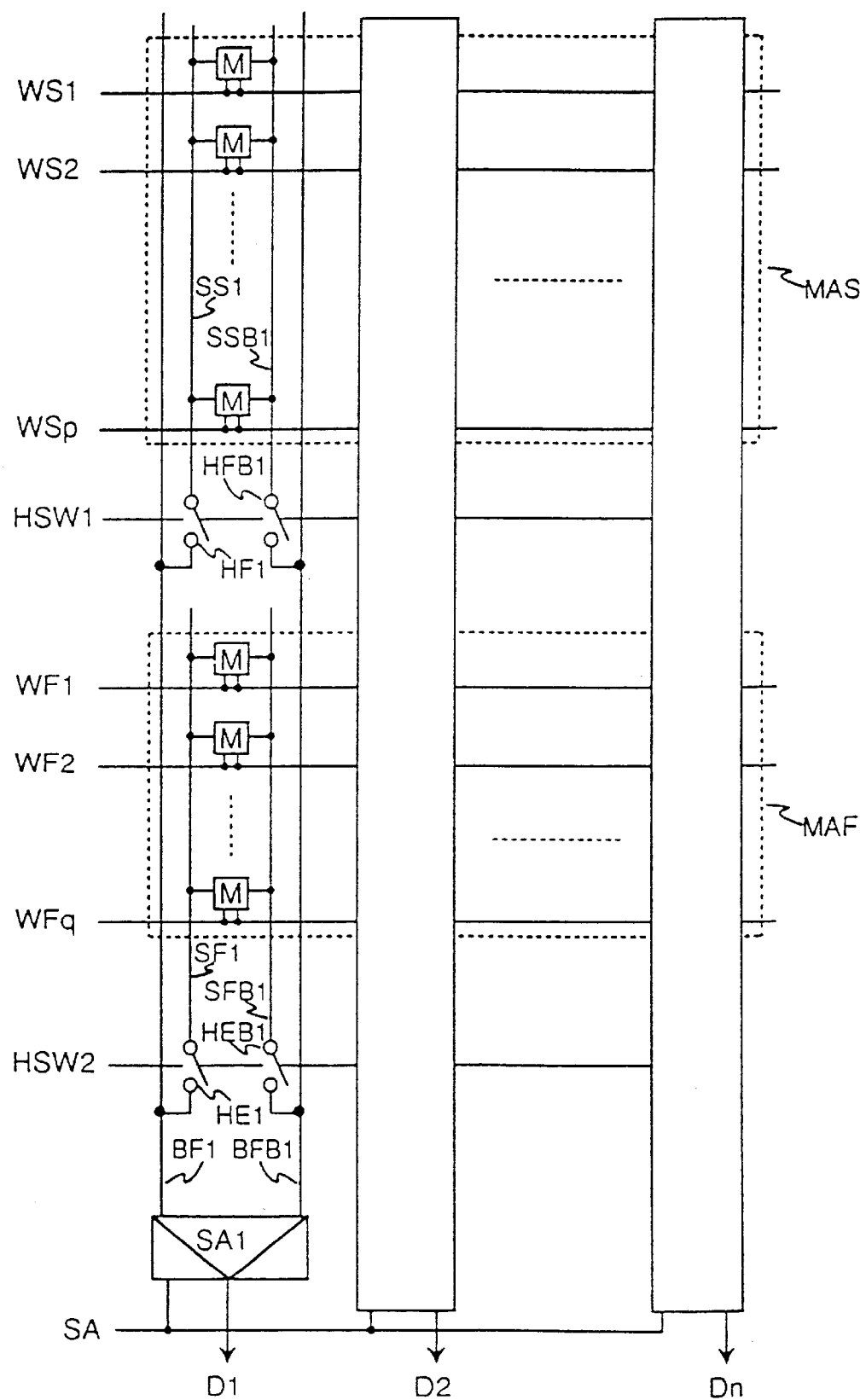
FIG. 13 is a diagram showing the construction of a memory device of a ninth embodiment of the present invention.
Figure 14:
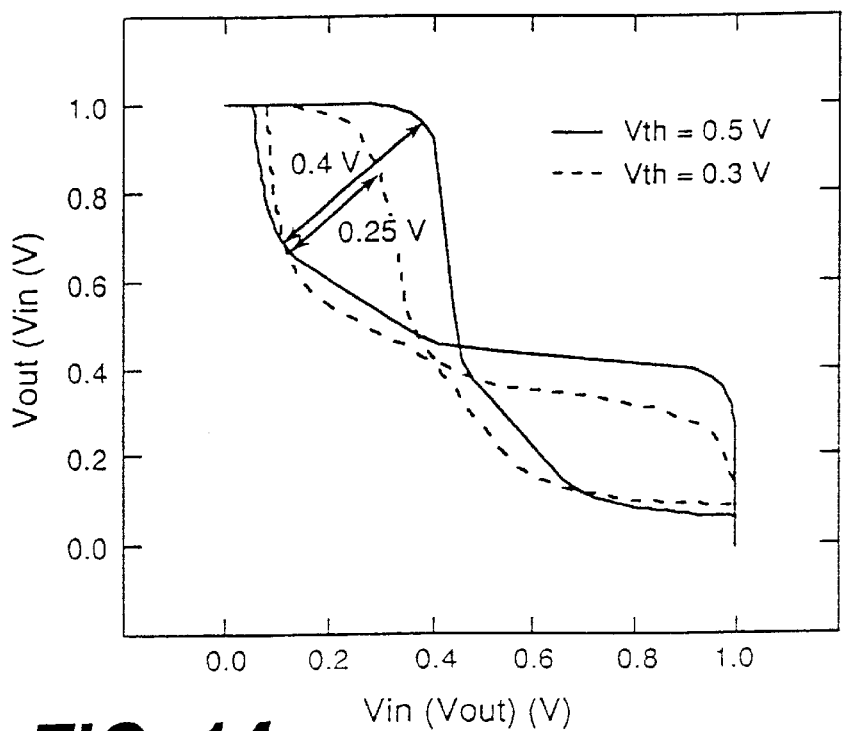
FIG. 14 is a diagram illustrating the static noise allowance of the memory cell.
Figure 15:
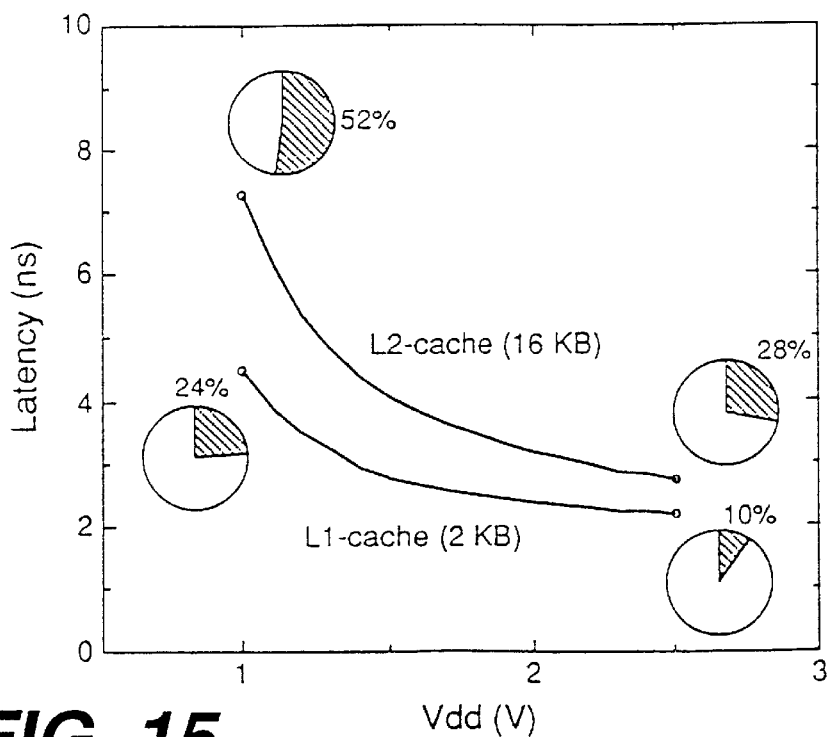
FIG. 15 is a diagram illustrating the dependence of the reading rate on the supply voltage.

FIG. 13 shows a ninth embodiment of the present invention. The description of the portions of the ninth embodiment that are similar to those of the memory devices of the first to eighth embodiments will be omitted. The memory device 1300 of the ninth embodiment can also used as an on-chip memory device or an off-chip memory device.

In the memory device 1300: reference symbols MAS and MAF designate memory cell arrays; M memory cells; HE1 and HEB1, and HF1 and HFB1 hierarchy switches; WS1 to WSp and WF1 to WFq word lines; SA1 a sense amplifier; SA a sense amplifier starting signal; and SS1 SSB1, SF1 and SFB1, and BF1 and BFB1 bit lines.

When the hierarchy designating signal HSW1 is asserted, the hierarchy switches HE1 and HEB1 are turned on to connect the bit line SF1 to the bit line BF1 and the bit line SFB1 to the bit line BFB1. When the hierarchy designating signal HSW2 is asserted, the hierarchy switches HF1 and HFB1 are turned on to connect the bit line SS1 to the bit line BF1 and the bit line SSB1 to the bit line BFB1. The bit lines BF1 and BFB1 are connected to the sense amplifier SA1 to SAn. As a result, the memory cell array HAF and the memory cell array HAS are simultaneously connected to the sense amplifiers when the hierarchy designating signal HSW1 and the hierarchy designating signal HSW2 are asserted.

If the hierarchy designating signal HSW2 is asserted, the embodiments of FIGS. 1 to 12 can be practiced as they are, to bring about similar effects. However, the reading from the memory cell array MAF is influenced by the capacitances of the bit lines BF1 and BFB1 so that it is retarded from those of the embodiments of FIGS. 1 to 12. The effects of the embodiment of FIG. 4 can be achieved by making the capacity of the memory cell array MAF smaller than that of the memory cell array MAS (i.e., p>q).

If the hierarchy designating signal HSW2 is negated, the reading from the memory cell array MAS is not loaded with the memory cell array MAF so that it can be made faster than those of the embodiments of FIGS. 1 to 12.

No specification is made for the supply voltage in the foregoing embodiments, but the following effects can be achieved if the device is operated at a voltage as low as 1.0 V. At a low voltage, generally speaking, there arises a problem that the operation speed of the circuit drops. The method for solving that problem is exemplified by lowering the threshold voltage of the MOS transistor, but raises another problem that the leakage current increases. If the threshold voltage of the MOS transistors composing the memory cells is lowered, the leakage current cannot be ignored because of the large scale of the memory cells and their low action frequency. By adopting the method of the present invention, a fast reading can be realized even if the high threshold voltage of the MOS transistors is used, because a portion of the memory array can operate at high speeds.

Moreover, the hierarchy switches, as used in the foregoing embodiments, can be replaced by a semiconductor device having an amplifying function such as a sense amplifier to speed up the operations. In this modification, the sense amplifier has to be constructed to provide the hierarchy switch function.

Tenth Embodiment

Figure 16:
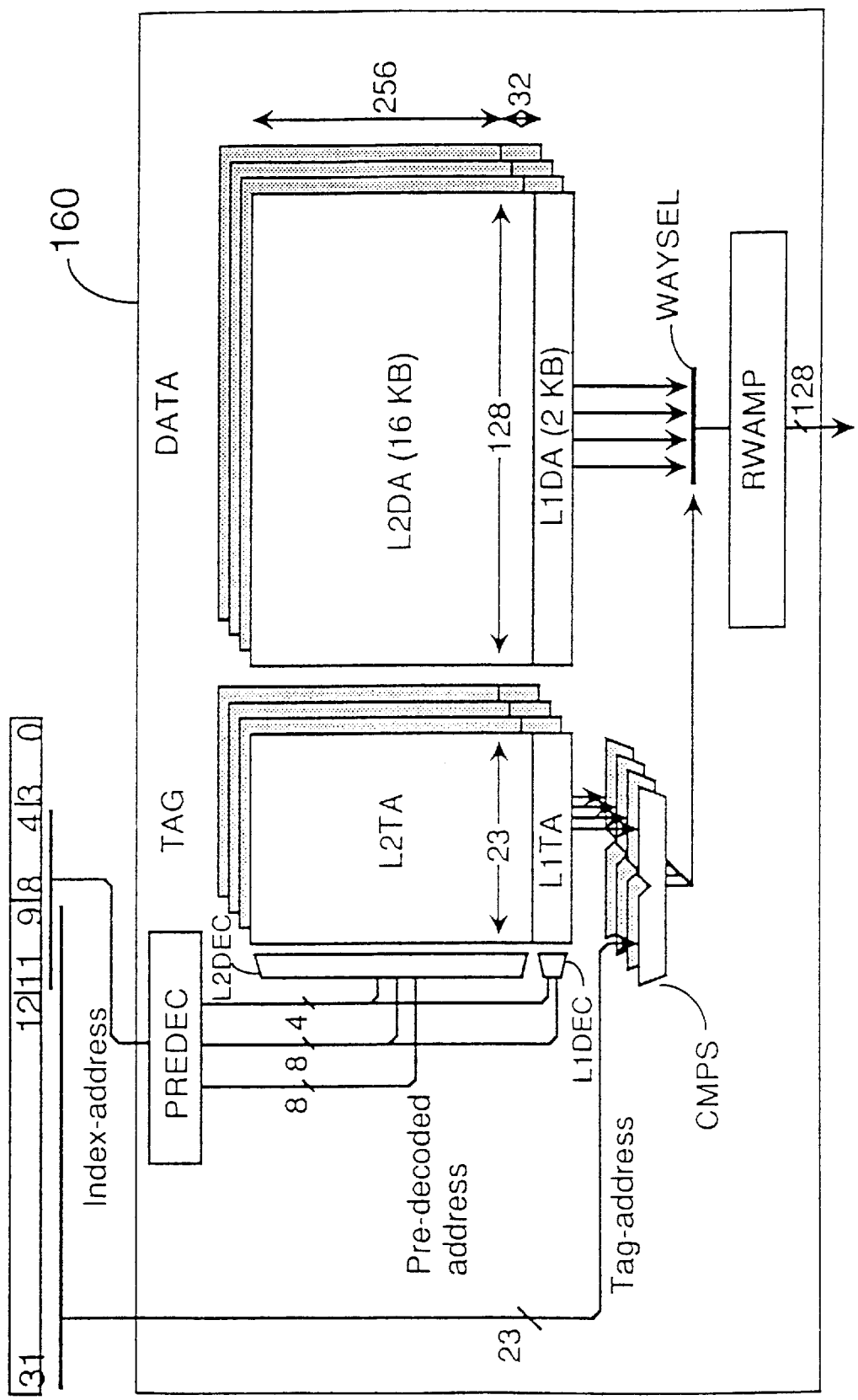
FIG. 16 is a diagram showing the logic image of the cache memory of the tenth embodiment of the present invention.

FIG. 16 is a logical block diagram showing of a cache memory according to the tenth embodiment of the present invention. The present embodiment is a cache memory of a four-way set associative structure realized by modifying the memory device of the third embodiment. The cache memory 160 is constructed of a secondary cache memory of 16 Kbytes and a primary cache memory of 2 Kbytes. The cache memory 160 includes: a tag array L2TA and a data array L2DA of a secondary cache memory; a tag array L1TA and a data array L1DA of a primary cache memory; a decoder L2DEC (the tag array and the data array have different decoders, although not shown) of the secondary cache memory; a decoder L1DEC (the tag array and the data array have different decoders, although not shown) of the primary cache memory; a way selector WAYSEL; a read/write amplifier RWAMP; a comparator CMPS; and a pre-decoder PREDEC.

Tag array L2TA is constructed of a memory array of 4×256 rows×23 bits. The data array L2DA is constructed of a memory array of 4×256 rows×128 bits. The tag array L1TA is constructed of a memory array of 4×32 rows×32 bits. The data array LiDA is constructed of a memory array of 4×32 rows×128 bits. The index address (Index-address) having a length of 8 bits is decoded to three groups of pre-decoded addresses of 8 bits, 8 bits and 4 bits by the pre-decoder PREDEC. The secondary cache memory decodes all three groups of pre-decoded addresses by the decoder L2DEC. On the other hand, the primary cache memory decodes only the two groups of pre-decoded address by the decoder L1DEC. The tag address having a length of 23 bits is compared by the four comparators CMPS- with the address which is read out from the tag array L1TA or the tag array L2TA.

Figure 17:
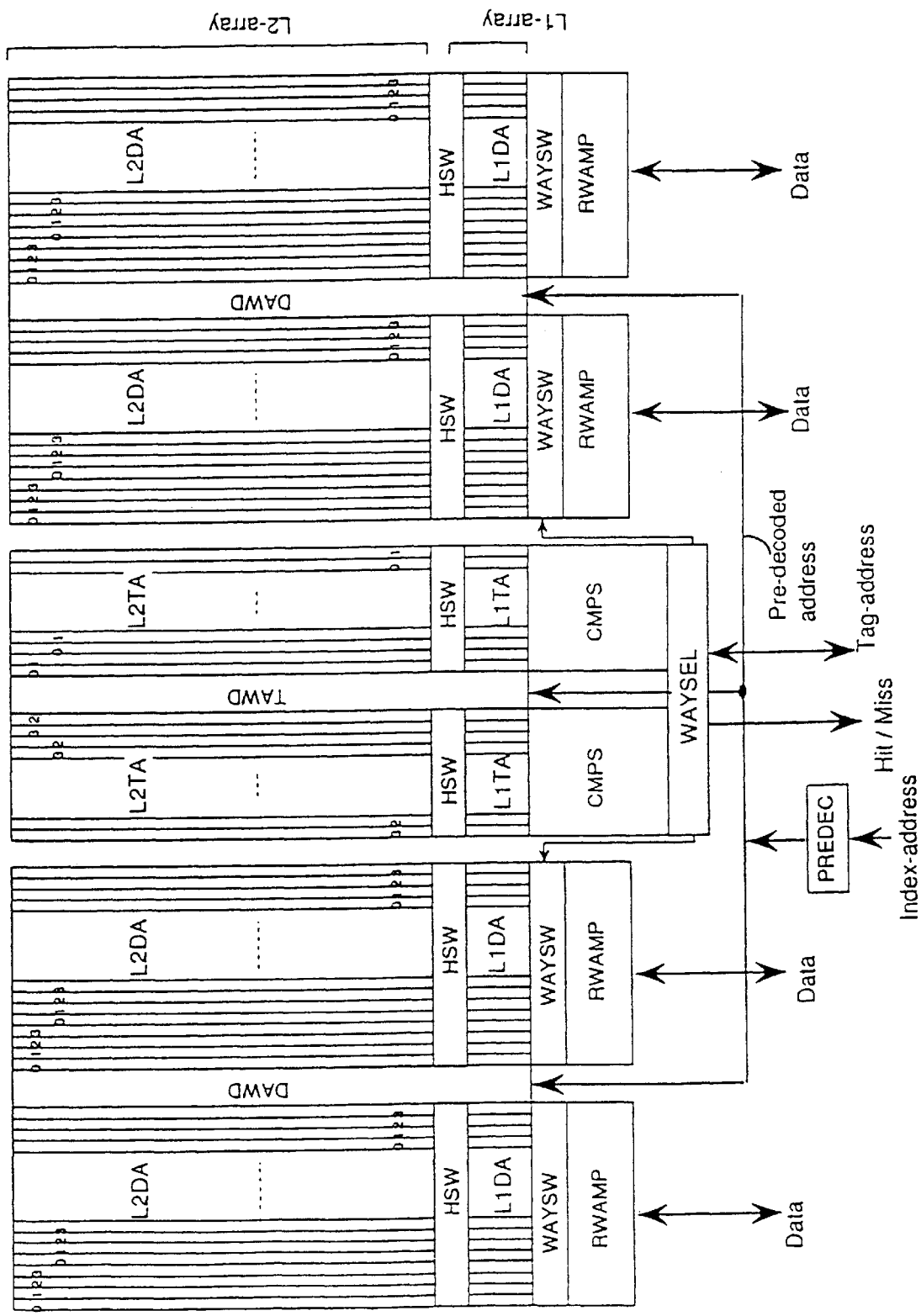
FIG. 17 is a diagram showing the layout image of the cache memory of the tenth embodiment of the present invention on the semiconductor chip.

FIG. 17 is a block diagram showing the layout image on the semiconductor chip of the cache memory 160. Two data arrays L2DA and two data arrays L2DA are separately arranged across a decoder/driver DAWD. Two tag arrays L2TA and two tag arrays L3TA are also separately arranged across the decoder/driver TAWD. Two data arrays L2DA and two data arrays L2DA are further separately arranged across the two tag arrays L1TA and the two tag arrays L2TA. In short, the memory array is arranged symmetrically with respect to the plane of the decoder/driver TAWD. Incidentally, this decoder/driver TAWD corresponds to the decoders L1DEC and L2DEC of FIG. 16. The decoder/driver DAWD also corresponds to the decoders L1DEC and L2DEC of FIG. 16.

The data array L2DA and the data array L1DA are connected through the hierarchy switch HSW. The tag array L2TA and the tag array L1TA are connected through the hierarchy switch HSW. In other words, the second cache memory L2-array and the primary cache memory L1-array are connected through the hierarchy switch HSW. The symbols (0, 1, 2 and 3) appearing in the data array L2DA and the tag array L2TA indicate the way numbers. The individual ways of the data array are selected by the way switch WAYSM according to the output of the way selector WAYSEL. Moreover, this way selector WAYSEL outputs the control signal Hit/Miss to inform the central processing unit CPU or the like of the hit or miss of the cache memory. The data is read out from and written in the data arrays L1DA and L2DA through the data bus Data and the read/write amplifier RWAMP.

Figure 18:
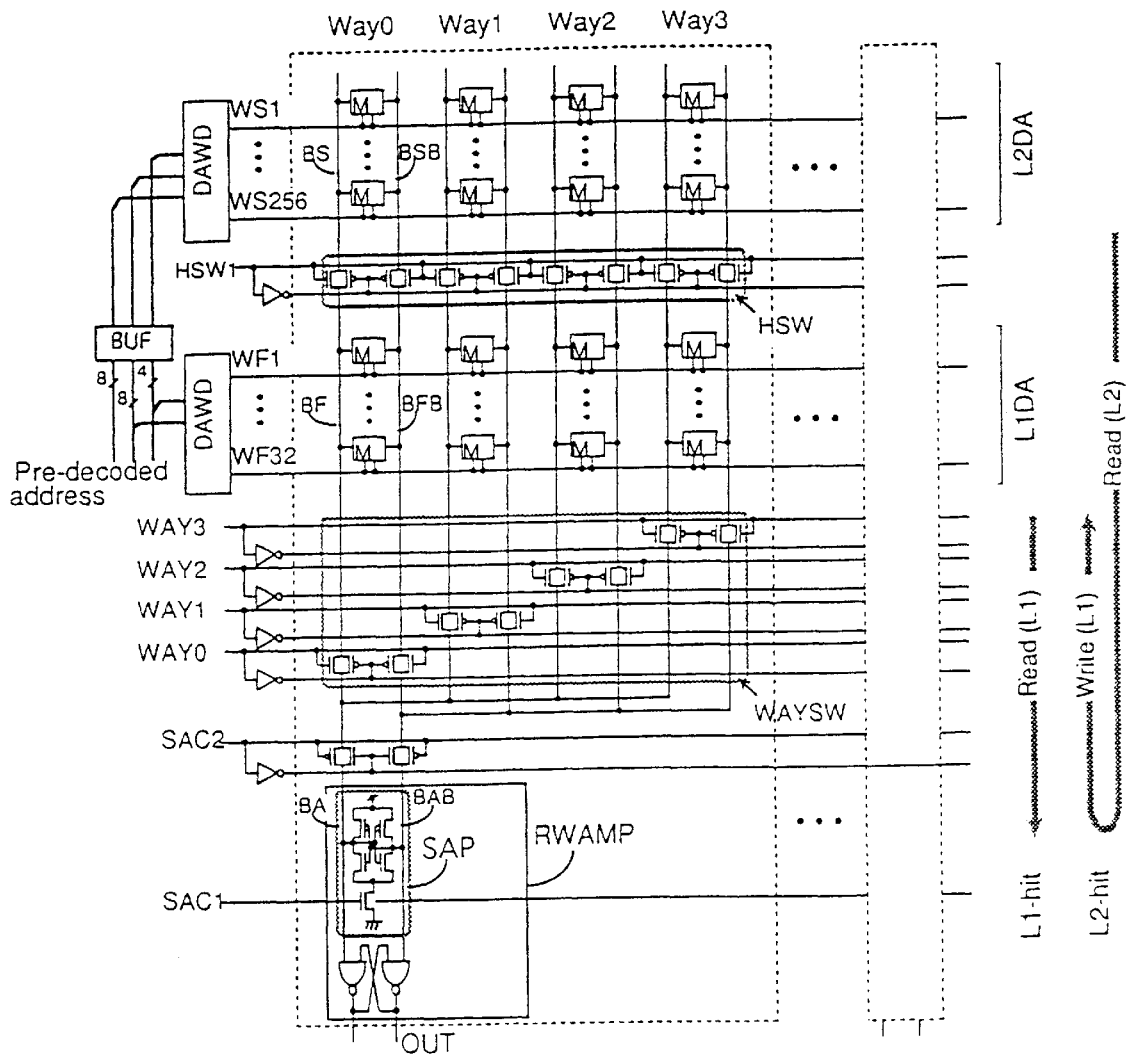
FIG. 18 is a diagram showing a circuit of the data array of the cache memory of the tenth embodiment of the present invention.

FIG. 18 is a circuit diagram showing the data arrays L1DA and L2DA. The present embodiment is a modification achieved by applying the fourth embodiment to the 4-way memory. The equalizer circuit is omitted from FIG. 18 to prevent the illustration from being complicated. The bit line pair BS and BSB of the secondary cache memory array and the bit line pair BF and BFB of the primary cache memory are separated by the hierarchy switch HSW. The four bit line pairs corresponding to the four ways are connected through the way switch WAYSW with the read/write amplifier RWAMP. As a result, the number of amplifiers is equalized to that of the line size. This reduction in the number of amplifiers is effective in reducing the power consumption. Incidentally, the write amplifier is omitted from the read/ write amplifier RWAMP of FIG. 18 to avoid complicating the drawing. The way switch WAYSM is controlled by the way select signals WAY0, WAY1, WAY2, and WAY3 coming from the way selector WAYSEL.

The number (32 rows) of the memory cells connected to the bit line pair BF and BFB is about ten times smaller than that (256 rows) of the memory cells connected to the bit line pair BS and BSB. As a result, the read time period of the data array L1DA when the hierarchy switch HSW is off can be made shorter than that of the data arrays L2DA and L1DA when the hierarchy switch HSW is on. When the data requested are in the data array L1DA (when the primary cache memory is hit: L1-hit), the data in the data array L1DA are read out by the sense amplifier SAP through the way switch WAYSW. At this time, the hierarchy designating signal is negated and the hierarchy switch HSW is off. If the control signal SAC2 is negated when the sense amplifier start signal SAC1 is asserted, the bit line pair BA and BAB is isolated from the bit line pair BG and BFB so that the data can be read out at a high speed.

When the data requested are in the data array L2DA (when the secondary cache memory is hit: L2-hit), the data array L2DA is accessed to so that the data is written directly in the data array L1DA through the bit lines. The rewriting operation is carried out in the following manner by making use of the sense amplifier SAP. First of all, the data in the data array L2DA are read out by the sense amplifier SAP. Next, the hierarchy designating signal HSW1 is negated while keeping the control signal SAC2 asserted. The data read out from the data array L2DA are amplified on the bit line pair BF and BFB and written in the data array L1DA. Depending upon this rewriting sequence, no excess cycle is required for the writing from the data array L2DA to the data array L1DA.

This hierarchy cache memory is advantageous compared to that of the prior art in the occupied area, the power consumption and the reading time period. The peripheral circuit is used in common by the data array L1DA and the data array L2DA and by the tag array L1TA and the tag array L2TA, so that the occupied area necessary for the primary cache memory and the secondary cache memory can be reduced. Since the peripheral circuit is thus used in common, it is possible to reduce the power consumption at the rewrite sequence time. The bit lines are connected only through the hierarchy switch so that the time period necessary for the rewrite sequence can be ignored.

The buffer circuit BUF connected between the decoder/driver DAWD of the data array L1DA and the decoder/driver DAWD of the data array L2DA is provided to lighten the load upon the address of the primary cache memory. Since the reading time period has to be made shorter for the primary cache memory than for the secondary cache memory, the address is desirably input from the primary cache memory so as to lessen the load upon the address on the primary cache memory side.

Figure 19:
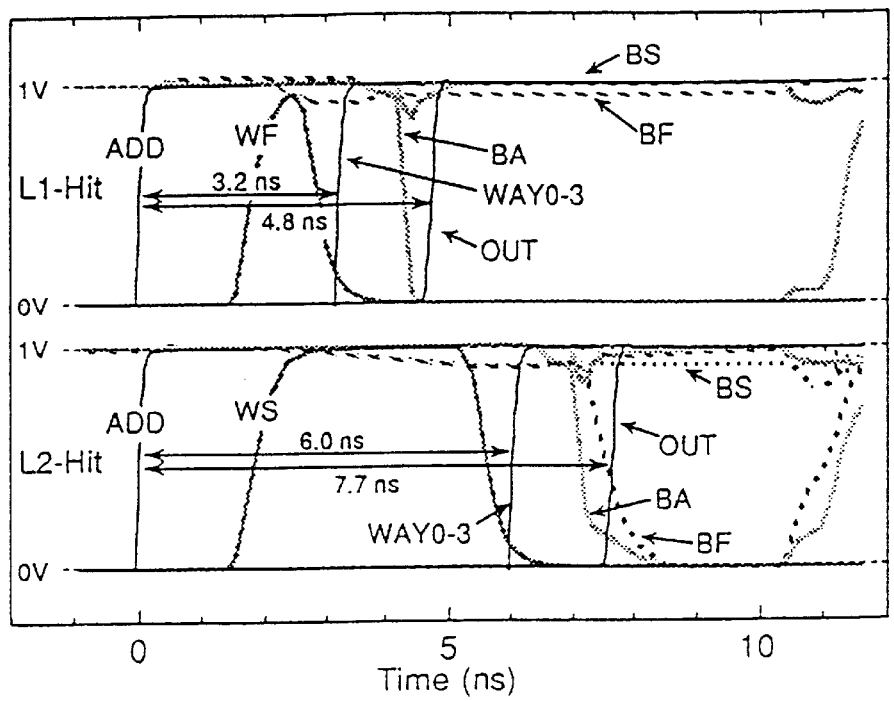
FIG. 19 is a diagram showing the simulation waveforms of the data array of the cache memory of the tenth embodiment of the present invention.

FIG. 19 shows the simulation waveforms of the data array when the primary cache memory is hit (on the upper side: L1-hit) and when the secondary cache memory is hit (on the lower side: L2-hit). The access time period is 4.8 ns for the hit of the primary cache memory; the access time period is 7.7 ns for the hit of the secondary cache memory. The access time period can be reduced by 38% in the present embodiment.

Figure 20:
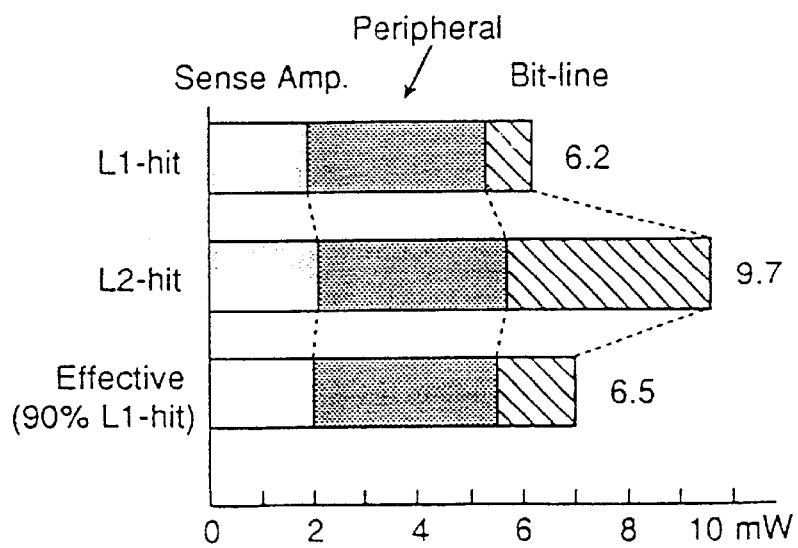
FIG. 20 is a diagram showing the simulation result of the power consumed by the data array of the cache memory of the tenth embodiment of the present invention.

FIG. 20 shows the simulation result of the power consumed by the data array when the supply voltage is 1 V and the operation frequency is 100 MHz. The consumed power is 6.2 mW for the hit of the primary cache memory (L1-hit). The consumed power is increased by 3.6 mW to 0.7 mW when the primary cache memory is rewritten (when the secondary cache memory is hit (L2-hit)). If the hit percentage of the primary cache memory is assumed to be 90%, the effective consumed power is reduced to 6.5 mW (by 23% from 8.4 mW of the data array of 18 Kbytes of the prior art).

Figures 21, 22, 23:
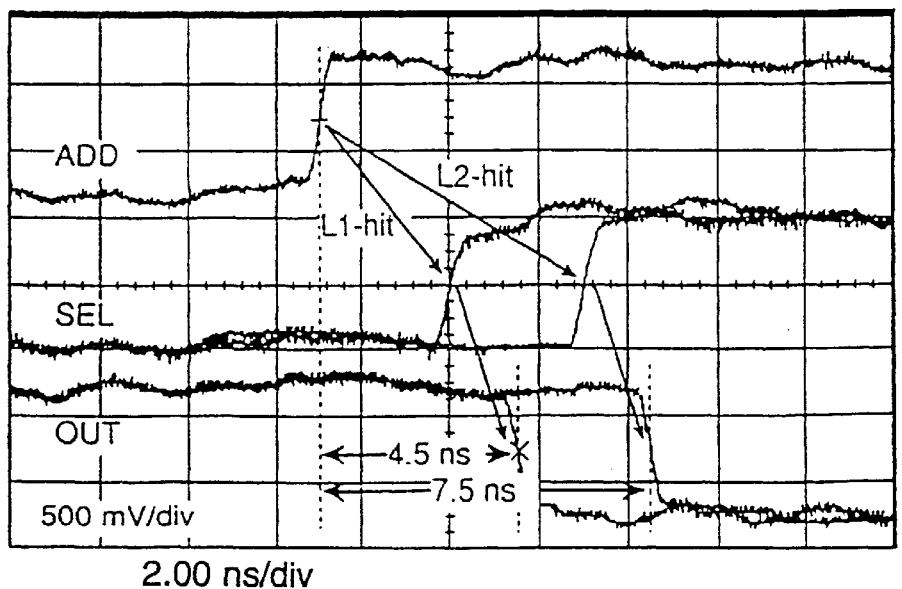
FIG. 21 is a diagram showing the feature of the prototype chip of the cache memory of the tenth embodiment of the present invention.
FIG. 22 is a diagram presenting the parameters of the process and device of the chip of the cache memory of the tenth embodiment of the present invention made experimentally.
FIG. 23 is a diagram showing the measured waveforms of the data array of the chip of the cache memory according to the tenth embodiment of the present invention made experimentally.

FIG. 21 shows the features for a chip which is prepared by CMOS process technology for the three-level metal wiring lines of 0.26 μm. FIG. 22 shows the parameters for the process and the device. In order to achieve good features for a supply voltage of 1 V, the gate oxide film of the MOSFET has a thickness of 4.5 nm. For a high reliability (high noise allowance) and the compatibility with the process of the logic circuits LSI such as the CPU, the memory cell a 6-transistor cell (a complete CMOS type memory cell) Moreover, the threshold voltages are made different between the MOS transistors of the peripheral circuit and the MOS transistors of the memory cells. The former is 0.3 V whereas the latter is 0.5 V. The cache memory has a size of 3.6 mm×2.1 mm.

FIG. 23 shows the measured waveforms of the data array. The symbol ADD denotes an address input; SEL a way select signal from the tag array; and OUT an output signal from the data array corresponding to the way select signal SEL. The access time period is 4.5 ns for the hit of the primary cache memory. The access time period is 7.5 ns for the hit of the secondary cache memory. This result is substantially identical to the simulated result. Since the hit percentage of the primary cache memory is about 90%, the effective access time period is 5 ns.

Eleventh Embodiment

Figure 24:
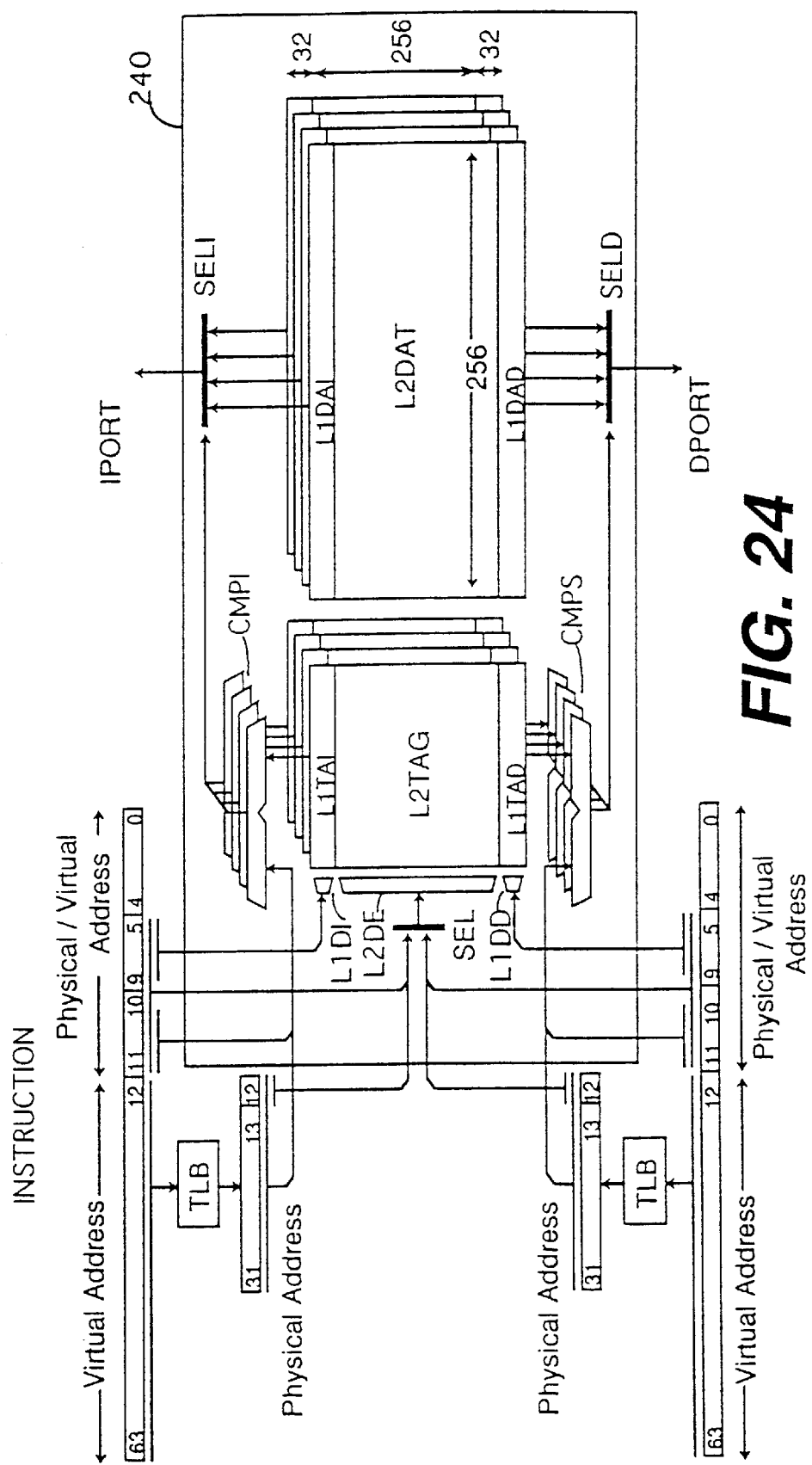
FIG. 24 is a diagram showing the logic image of the cache memory of the eleventh embodiment of the present invention.

FIG. 24 is a block diagram showing the logic image of a cache memory of an eleventh embodiment of the present invention. The present embodiment is constructed by applying the memory device of the sixth embodiment to the cache memory having a 4-way set-associative structure. A cache memory 240 has an instruction port IPORT and a data port DPORT. This cache memory is used as one acting as both an instruction cache and a data cache by connecting the instruction path of the microprocessor or the like and the data path. In short, the cache memory 240 is a unified cache having two ports.

The cache memory 240 is constructed of a secondary cache memory of 32 Kbytes and two primary cache memories of 4 Kbytes. The cache memory 240 includes: a tag array L2TAG and a data array L2DAT of the secondary cache memory; tag arrays L2TAI and L1TAD and data arrays L1DAI and L1DAD of the primary cache memory; a decoder L2DE (the tag array and the data array have different decoders, although not shown) of the second cache memory; decoders L1DI and L1DD (the tag array and the data array have different decoders, although not shown) of the primary cache memory; way selectors SELI and SELD; comparators CMPI and CMPD; and an address selector SEL. The tag array L2TAG is constructed of a memory array of 4×256 rows×23 bits. The data array L2DAT is constructed of a memory array of 4×256 rows×256 bits. The tag array L1TAG is constructed of a memory array of 4×32 rows×23 bits. The data array L1DAT is constructed of a memory array of 4×32 rows×256 bits.

Incidentally, the cache memory 240 is arranged on the physical address side. Specifically, the cache memory 240 is accessed after the translation from the logical address (Virtual Address) to the physical address by the address translation buffer TLB in the memory management unit (MMU). The address selector SEL selects the address signals for the access to the secondary cache memory from the instruction port side and for the access to the secondary cache memory from the data port side. When accesses occur simultaneously, the address selector SEL selects an address signal in accordance with a predetermined priority.

Figure 25:
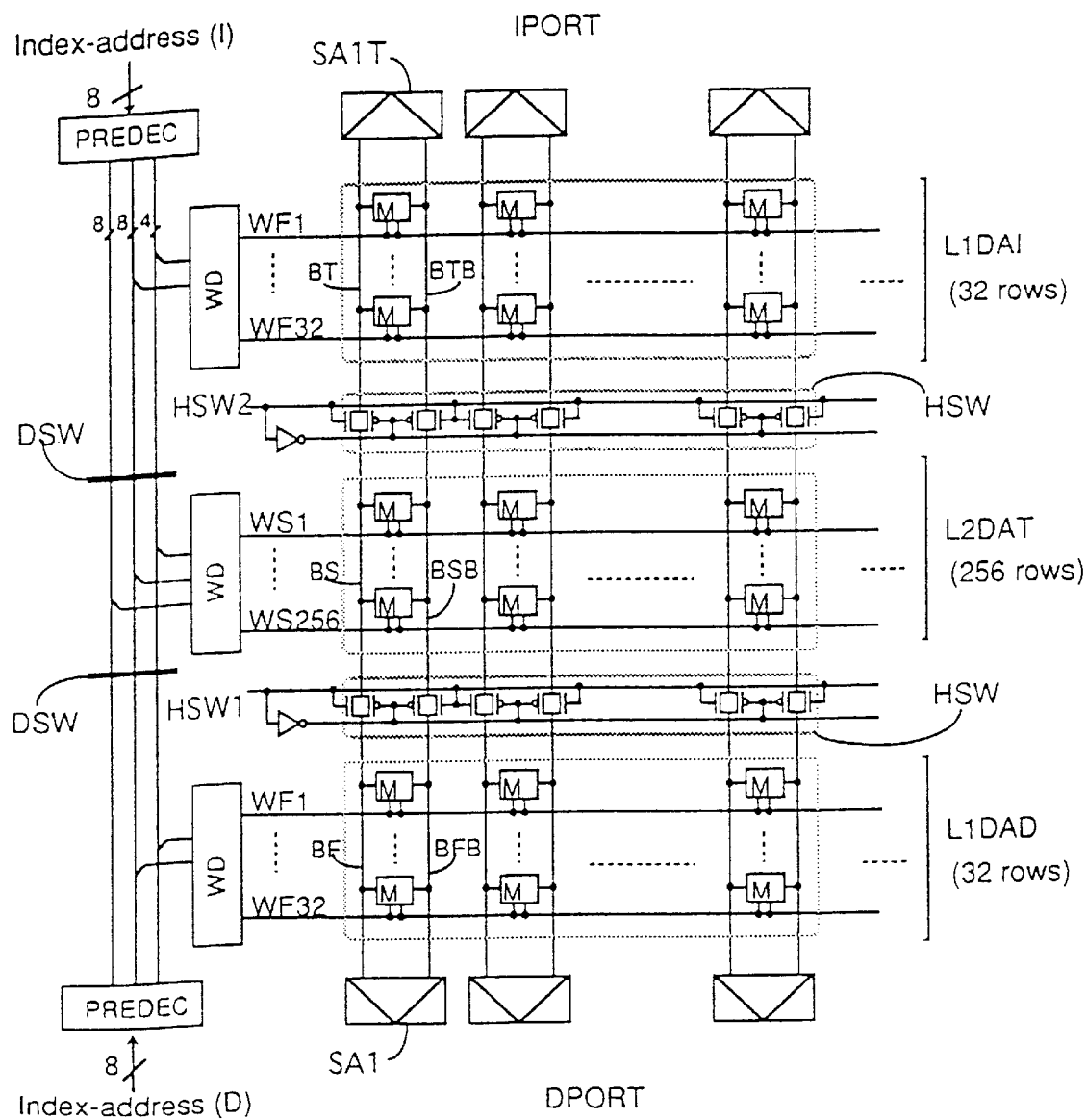
FIG. 25 is a diagram showing the circuit of the data array of the cache memory of the eleventh embodiment of the present invention.

FIG. 25 is a circuit diagram of the data arrays L2DAT, L1DAD, and L1DAI. The construction of FIG. 25 is basically identical to that of the sixth embodiment of FIG. 10 with the exception that the hierarchy switch HSW is specifically shown and that the pre-decoder PREDEC and the decoder/word driver WD are shown. The index address of the instruction and the data is decoded into three groups of pre-decoded addresses by the pre-decoder PREDEC. The secondary cache memory decodes all three groups of the pre-decoded addresses by the decoder/word driver WD. On the other hand, the primary cache memory decodes only two groups of pre-decoded addresses by the decoder/word driver WD. The pre-decoded address signal is turned on/off by the decoder switch DSW which is connected between the primary cache memory and the secondary cache memory. This is intended to realize the function of the address selector SEL of FIG. 24 and to lighten the load of the pre-decoded address signal at the time of accessing the primary cache memory.

Since the storage capacity and the reading time of the primary cache memory are reduced, the reading time of the primary cache memory can be suppressed to a short period even when the time period for translating the logic address to the physical address by the address translation buffer TLB is taken into consideration.

Generally speaking, the unified cache has a higher hit percentage than the separate cache. On the other hand, the separate cache can double the band width between the microprocessor and the cache memory. As a result, the cache memory 240 can have the advantages of both the separate cache and the unified cache of the prior art.

Twelfth Embodiment

Figure 26:
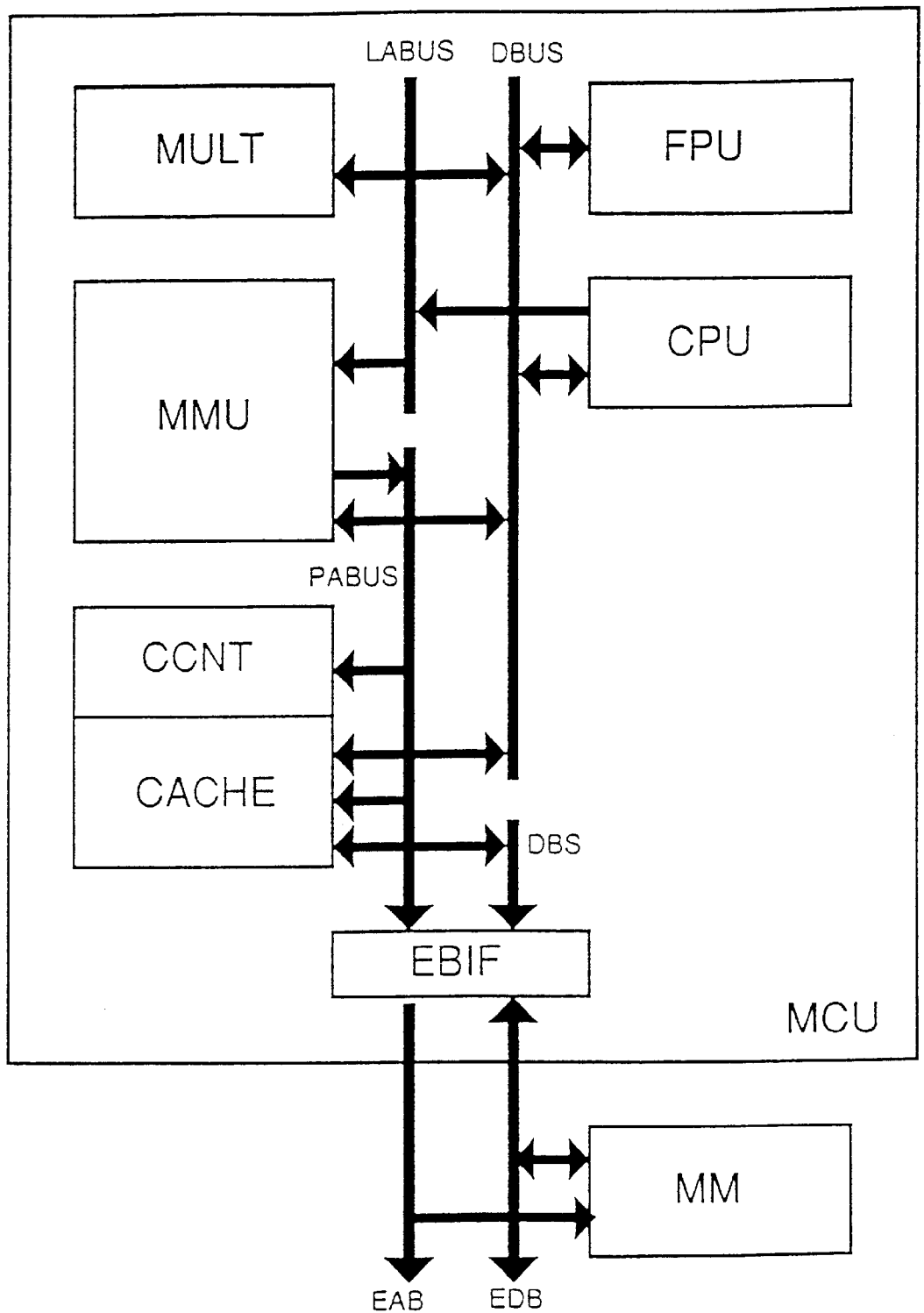
FIG. 26 is a block diagram of a system using a microcomputer in which a cache memory of the present invention is packaged.

FIG. 26 shows one example of a system comprising a microcomputer MCU using a cache memory of the present invention and a main memory MM. The microcomputer MCU is constructed to include a central processing unit CPU, a floating point processing unit FPU, a multiplier MULT, a memory management unit MMU, a cache memory controller CCNT, a cache memory CACHE, a 32-bit data bus DBUS, a 32-bit logical address bus LABUS, a 32-bit physical address bus PABUS, a 32-bit data bus DBS and an external bus interface EBIF, and is formed over a single semiconductor substrate made of single crystal silicon or the like. In this example, an instruction cache and a data cache exist together. The microcomputer MCU and the main memory MM are connected to each other through an external data bus EDB and an external address bus EAB. The main memory MM is exemplified by a semiconductor memory which is composed of dynamic memory cells of DRAM (Dynamic Random Access Memory) type or synchronous DRAM type.

The cache memory CACHE is exemplified by a four-way set associative cache memory, as constructed of a level 1 cache memory unit composed of four sets of tag units and data units and a level 2 cache memory unit composed of four sets of tag units and data units. The bit lines of the level 1 cache memory unit and the bit lines of the level 2 cache memory unit are connected through hierarchy switches.

These hierarchy switches are controlled by signal lines coming from the cache controller CCNT. Since the level 1 cache memory and the level 2 cache memory are packaged in the microcomputer, the processing rate is improved. The storage capacity is made larger in the order of the level 1 cache memory, the level 2 cache memory and the main memory MM. The access time is made longer in the order of the level 1 cache memory, the level 2 cache memory and the main memory MM. These level 1 cache memory, level 2 cache memory and main memory MM form the hierarchy of the memory altogether.

Figure 27:
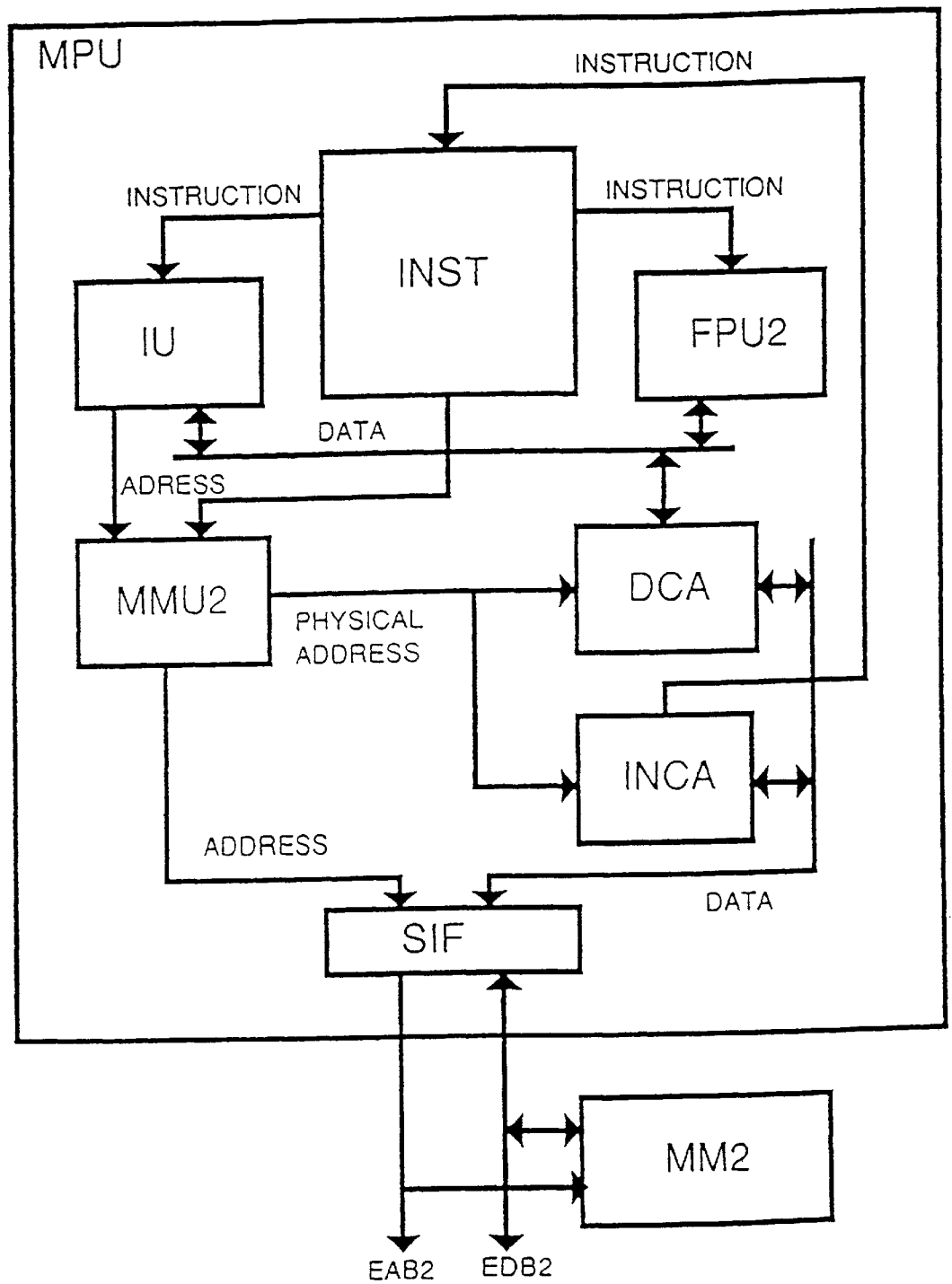
FIG. 27 is a block diagram of a system using a microcomputer in which a cache memory of the present invention is packaged.

FIG. 27 shows an example of a system comprising a microprocessor MPU using the cache memory of the present invention and a main memory MM2. The microprocessor MPU is constructed to include an instruction unit INST, a floating point processing unit FPU2, an integer processing unit IU, a memory management unit MMU2, an instruction cache memory INCA, a data cache memory DCA and a system interface SIF, and is formed over a single semiconductor substrate made of single crystal silicon or the like. In this example, the data cache memory and the instruction cache memory are separated from each other. The microprocessor MPU and the main memory MM2 are connected to each other through an external data bus EDB2 and an external address bus EAB2. The main memory MM2 is exemplified by a semiconductor memory using dynamic memory cells like the main memory MM of FIG. 26.

The instruction cache memory INCA and the data cache memory DCA can have a construction similar to that of the cache memory CACHE of FIG. 26. The level 1 cache memory and the level 2 cache memory are packaged in the microprocessor so that the processing rate can be improved as in the embodiment of FIG. 26. When the dual port memory is used in the data cache memory DCA, the concurrent arithmetic operation can be accomplished to further enhance the processing rate, if the integer processing unit IU and the floating point processing unit FPU are connected to the data cache memory DCA through different data paths. As in the example of FIG. 26, the level 1 cache memory, the level 2 cache memory and the main memory MM2 form the hierarchy of the memory altogether.

Since the primary cache memory and the secondary cache memory are incorporated in a semiconductor data processing device such as a microprocessor, as in the twelfth and thirteenth embodiments, it is possible to incorporate a cache memory having a high hit percentage. Since the access to an (one) off-chip memory having a high load can be reduced by incorporating the cache memory having the high hit percentage, it is possible to reduce the power consumption of not only the semiconductor data processing device but also the entire portable information device using the semiconductor data processing device. Moreover, the access to the on off-chip memory having a long reading time is reduced so that the operation can be speeded up.

Although the invention has been specifically described in connection with the foregoing embodiments, it is limited thereto and can naturally be modified in various manners without departing from the gist thereof. For example, the memory cells may be, instead of the static memory cells in the foregoing embodiments, dynamic memory cells, non-volatile memory cells, or associative memory cells. Moreover, the memory cells of the memory array MAF may be static memory cells, and the memory cells of the memory array MAS may be dynamic memory cells. Still moreover, the memory cells of the memory array MAF may be static memory cells, and the memory cells of the memory array MAS may be non-volatile memory cells. In this case, the memory array MAS may be used as the main memory. In a microcomputer having a large storage capacity DRAM and a large storage capacity ROM packaged therein, the memory array MAF can be operated as a cache memory to bring about the effects of high speed operation and low power consumption. Furthermore, the present invention can be applied to not only the cache memory but also the TLB (Translation Look-aside Buffer) of the address translation buffer of the memory management unit.

What is claimed is:

1. A semiconductor device comprising:
   a primary cache memory including a plurality first memory cells; and
   a secondary cache memory including a plurality of second memory cells;
   wherein said primary and secondary cache memories are hierarchized;
   wherein the semiconductor device has N-channel transistors with a first threshold voltage and a second threshold smaller than said first threshold voltage, and
   wherein said first and second memory cells have N-channel transistors with said first threshold voltage.

2. A semiconductor memory device according to claim 1,
   wherein a decoder included in the primary cache memory has N-channel transistors with said second threshold voltage.

3. A semiconductor device according to claim 2, further comprising:
   a switch circuit coupled between the bit lines of said primary cache memory and the bit lines of secondary cache memory.

4. A semiconductor device according to claim 3,
   wherein said first memory cells and secondary memory cells are static memory cells; and are arranged at the intersections of word lines and bit lines of the said primary and secondary cache memories.

5. A semiconductor device according to claim 4:
   wherein said primary cache memory and said secondary cache memory are formed on a single semiconductor substrate.

6. A semiconductor device according to claim 4:
   wherein the operating voltage of the device is under 1V.

7. A semiconductor device according to claim 4:
   wherein the primary cache memory has smaller storage capacity than said secondary cache memory.

8. A semiconductor memory device comprising:
   a first memory array including a plurality of word lines, a first bit line pair, and a plurality of memory cells arranged at the intersections of said plurality of word lines and said first bit line pair;
   a second memory array including a plurality of word lines, a second bit line pair, and a plurality of memory cells arranged at the intersection of said plurality of word lines and said second bit line pair;
   a peripheral circuit; and
   a switch circuit coupled between said first bit line pair and said second bit line pair;
   wherein the N-channel transistor of said memory cell has a first threshold voltage; and wherein the N-channel transistor of said peripheral circuit has a second threshold voltage smaller than said first threshold voltage.

9. A semiconductor memory device according to claim 8:
   wherein said peripheral circuit has a sense amplifier coupled to said second bit line pair.

10. A semiconductor device according to claim 9:
    wherein said first memory array is used as primary cache memory data array and
    wherein said second memory is used as secondary cache memory data array;
    and wherein said primary cache memory has a smaller storage capacity than said secondary cache memory.

11. A semiconductor device according to claim 1:
    wherein said plurality of first memory cells are coupled to a plurality of first word lines and a plurality of first bit lines, and
    wherein said plurality of second memory cells are coupled to a plurality of second word lines and a plurality of second bit lines, which are different from said first word lines and said first bit lines.

12. A semiconductor device according to claim 1, further comprising:
    a peripheral circuit including N-channel transistors having said second threshold voltage,
    wherein said primary and secondary cache memories have their bit lines divided.

* * * * *